(12) United States Patent
Tateishi

(10) Patent No.: US 8,093,088 B2
(45) Date of Patent: Jan. 10, 2012

(54) MANUFACTURING METHOD OF MICRO-ELECTRO-MECHANICAL DEVICE

(75) Inventor: Fuminori Tateishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/889,869

(22) Filed: Sep. 24, 2010

(65) Prior Publication Data

US 2011/0012111 A1 Jan. 20, 2011

Related U.S. Application Data

(62) Division of application No. 11/456,729, filed on Jul. 11, 2006, now Pat. No. 7,820,470.

(30) Foreign Application Priority Data

Jul. 15, 2005 (JP) ................................. 2005-207894

(51) Int. Cl.
*H01L 21/00* (2006.01)

(52) U.S. Cl. .................... 438/53; 257/419; 257/E21.002

(58) Field of Classification Search ................... 257/419, 257/E21.002; 438/53
See application file for complete search history.

(56) References Cited

U.S. PATENT DOCUMENTS

| | | | |
|---|---|---|---|
| 5,658,698 A | 8/1997 | Yagi et al. | |
| 5,844,286 A | 12/1998 | Hase | |
| 5,882,960 A | 3/1999 | Zhang et al. | |
| 5,895,933 A | 4/1999 | Zhang et al. | |
| 5,971,355 A | 10/1999 | Biegelsen et al. | |
| 6,020,215 A | 2/2000 | Yagi et al. | |
| 6,144,082 A | 11/2000 | Yamazaki et al. | |
| 6,452,238 B1 | 9/2002 | Orcutt et al. | |
| 6,608,357 B1 | 8/2003 | Yamazaki et al. | |
| 6,614,054 B1 | 9/2003 | Ahn | |
| 6,730,549 B1 | 5/2004 | Zhang et al. | |
| 6,756,657 B1 | 6/2004 | Zhang et al. | |
| 6,806,654 B2 | 10/2004 | Shannon | |
| 6,813,054 B2 | 11/2004 | Aksyuk et al. | |
| 6,822,293 B2 | 11/2004 | Yamazaki et al. | |
| 6,860,939 B2 | 3/2005 | Hartzell | |
| 6,940,564 B2 | 9/2005 | Murden et al. | |
| 6,969,630 B2 * | 11/2005 | Ozgur ............................ 438/53 |
| 7,045,459 B2 | 5/2006 | Freidhoff | |
| 7,078,768 B2 | 7/2006 | Yamazaki et al. | |

(Continued)

FOREIGN PATENT DOCUMENTS

EP 0 631 325 A2 12/1994

(Continued)

*Primary Examiner* — Steven J Fulk

(74) *Attorney, Agent, or Firm* — Fish & Richardson P.C.

(57) ABSTRACT

A method of forming a microstructure body and a semiconductor element for controlling the microstructure body over the same substrate to reduce manufacturing cost, for mass-production of micromachines having a microstructure. In manufacturing a micromachine, a sacrifice layer is formed using a mask material for forming a pattern of a film, and removal of the mask in a region for forming a semiconductor element and removal of the sacrifice layer and the mask in a region for forming a microstructure body are performed by the same step. Specifically, a manufacturing method of a micro-electro-mechanical device is provided wherein a sacrifice layer is selectively formed over an insulating substrate, a semiconductor layer is formed to cover the sacrifice layer, a mask is formed over the semiconductor layer, the semiconductor layer is etched using the mask, and the mask and the sacrifice layer are removed by the same step.

14 Claims, 17 Drawing Sheets

U.S. PATENT DOCUMENTS

| | | |
|---|---|---|
| 7,145,213 B1 * | 12/2006 | Ebel et al. .................. 257/414 |
| 7,148,094 B2 | 12/2006 | Zhang et al. |
| 7,560,789 B2 | 7/2009 | Izumi et al. |
| 7,638,429 B2 | 12/2009 | Freidhoff |
| 7,709,844 B2 | 5/2010 | Yamazaki et al. |
| 7,875,941 B2 | 1/2011 | Freidhoff |
| 8,008,737 B2 | 8/2011 | Izumi et al. |
| 2001/0023010 A1 | 9/2001 | Yamada et al. |
| 2002/0075094 A1 | 6/2002 | Bechtle et al. |
| 2003/0155643 A1 * | 8/2003 | Freidhoff .................. 257/704 |
| 2003/0215974 A1 | 11/2003 | Kawasaki et al. |
| 2004/0238821 A1 * | 12/2004 | Yang .............................. 257/72 |
| 2005/0001701 A1 | 1/2005 | Shirakawa |
| 2005/0003566 A1 | 1/2005 | Yamamoto |
| 2005/0077612 A1 | 4/2005 | Nikkel et al. |
| 2005/0190023 A1 | 9/2005 | Nakatani et al. |
| 2005/0205515 A1 | 9/2005 | Saga et al. |
| 2005/0218488 A1 | 10/2005 | Matsuo |
| 2005/0225921 A1 | 10/2005 | Nakatani et al. |
| 2005/0275072 A1 | 12/2005 | Haluzak et al. |
| 2006/0087716 A1 | 4/2006 | Kweon et al. |
| 2006/0181368 A1 | 8/2006 | Naniwada |
| 2006/0210106 A1 | 9/2006 | Pedersen |
| 2006/0218785 A1 | 10/2006 | Horiuchi et al. |
| 2006/0270238 A1 | 11/2006 | Izumi et al. |

FOREIGN PATENT DOCUMENTS

| | | |
|---|---|---|
| EP | 0 665 590 A2 | 8/1995 |
| EP | 1 026 751 A2 | 8/2000 |
| EP | 1 026 752 A2 | 8/2000 |
| JP | 07-321339 A | 12/1995 |
| JP | 07-329237 A | 12/1995 |
| JP | 08-084484 A | 3/1996 |
| JP | 09-007946 A | 1/1997 |
| JP | 10-002912 A | 1/1998 |
| JP | 2000-036599 A | 2/2000 |
| JP | 2001-144117 A | 5/2001 |
| JP | 2002-062493 A | 2/2002 |
| JP | 2004-001201 A | 1/2004 |
| JP | 2004-133281 A | 4/2004 |
| JP | 2005-517546 A | 6/2005 |
| JP | 4519804 A | 8/2010 |
| WO | 03/070625 A2 | 8/2003 |
| WO | WO 03078299 A1 * | 9/2003 |

* cited by examiner

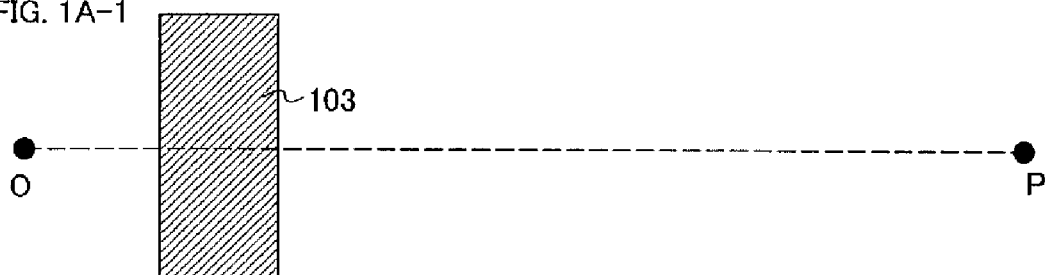
FIG. 1A-1
FIG. 1A-2
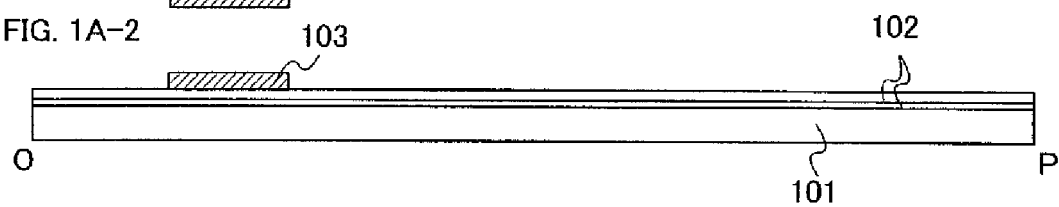
FIG. 1B-1
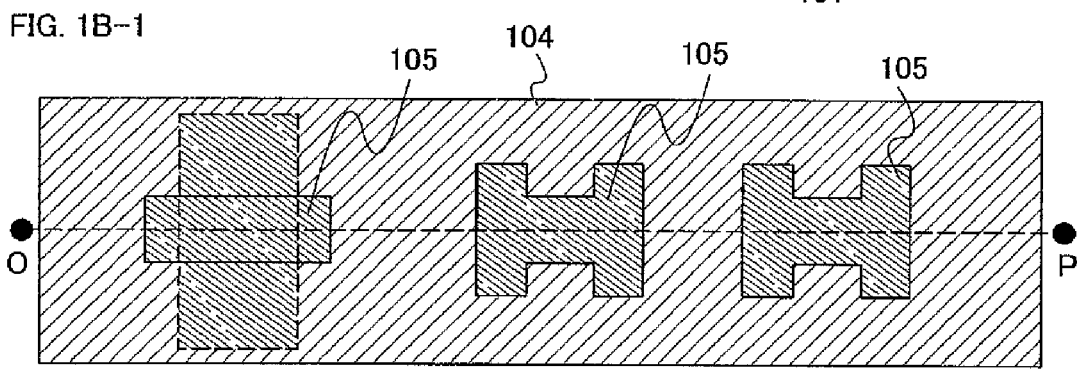
FIG. 1B-2
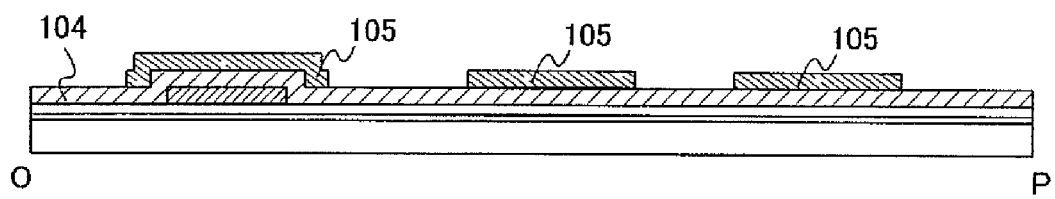
FIG. 1C-1
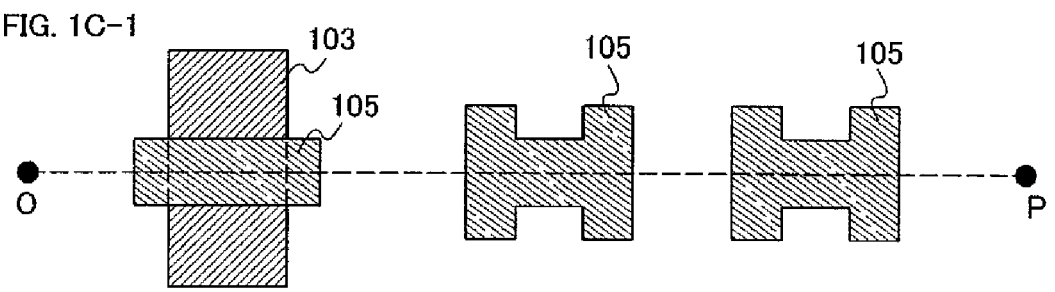
FIG. 1C-2
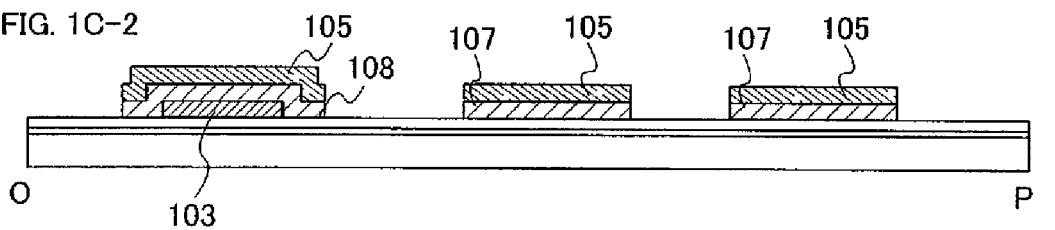

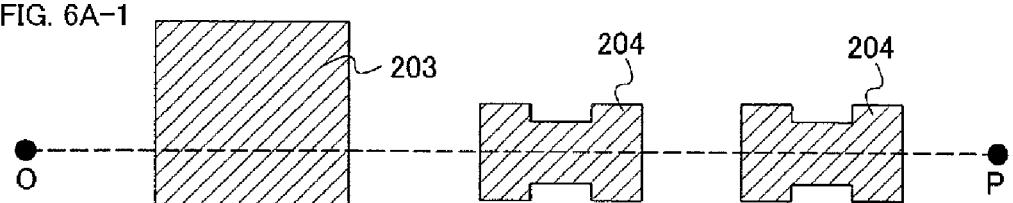
FIG. 6A-1
FIG. 6A-2
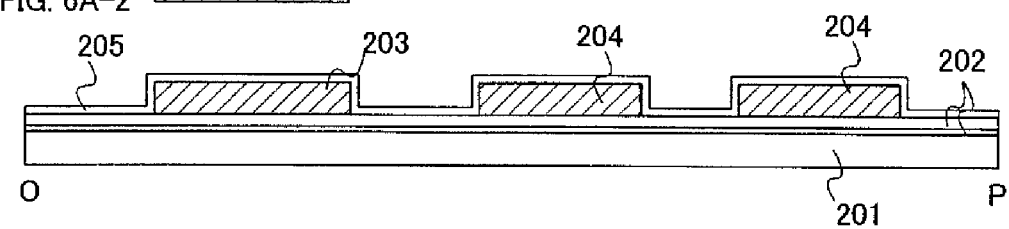
FIG. 6B-1
FIG. 6B-2
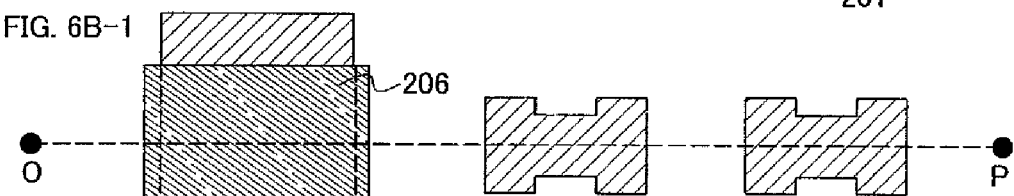
FIG. 6C-1
FIG. 6C-2
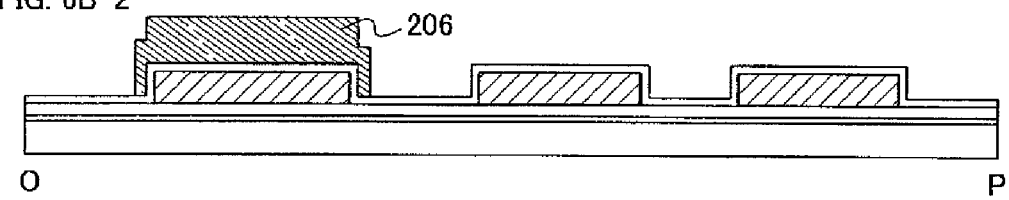
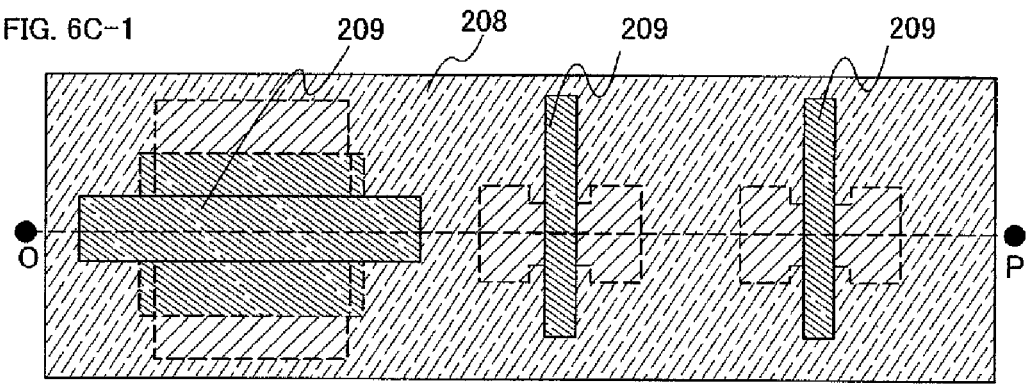
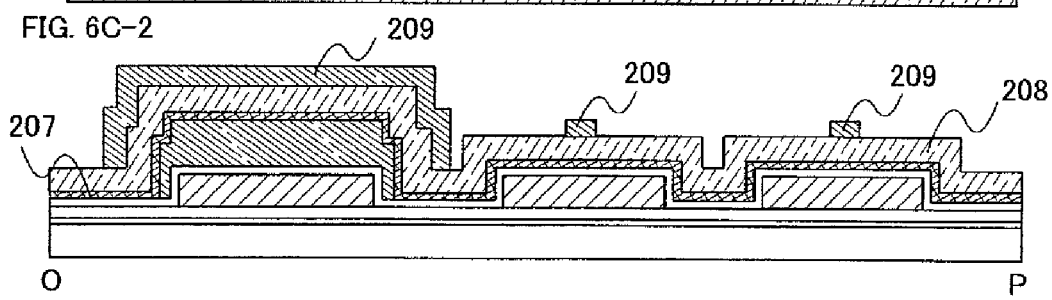

MANUFACTURING METHOD OF MICRO-ELECTRO-MECHANICAL DEVICE

CROSS-REFERENCE TO RELATED APPLICATIONS

This application is a divisional of U.S. application Ser. No. 11/456,729, filed Jul. 11, 2006, now allowed, which claims the benefit of a foreign priority application filed in Japan as Serial No. 2005-207894 on Jul. 15, 2005, both of which are incorporated by reference.

BACKGROUND OF THE INVENTION

1. Field of the Invention

The present invention relates to a micro-electro-mechanical device which has a microstructure body and a semiconductor element over the same surface, and a manufacturing method thereof.

2. Description of the Related Art

In recent years, research on a micro-mechanical system which is called a "MEMS" has been actively developed. "MEMS" (Micro-electro-mechanical system) is an acronym of a micro-electro-mechanical system, and is called a "micromachine" (a semiconductor device including a micromachine). "Micromachine" is not clearly defined now, however, generally means a micro-device in which "a movable microstructure body having a stereoscopic structure" and "an electronic circuit having a semiconductor element" are integrated using a semiconductor fine-processing technology. The microstructure body is different from the semiconductor element, and has a movable portion having a stereoscopic structure and is provided with space for operating the movable portion.

In the micromachine, the microstructure body can be controlled by the electronic circuit. Therefore, unlike a conventional device which is controlled by central processing using a computer, the micromachine may be constructed as an autonomous decentralized system: such a series of operations is performed that information obtained with a sensor is processed by the electronic circuit and action is taken through an actuator.

There have been many studies on such micromachines. As for the manufacturing process, for example, since it has been impossible to be compatible with wafer manufacturing or a plastic assembly facility, an improved MEMS wafer level package has been proposed (Reference 1: Japanese Patent Laid-open No. 2001-144117).

Further, there is a document on an electro-mechanical device called a "MEMS" (Reference 2: Japanese Patent Laid-open No. 2004-1201). As a starting material of a thin film, an amorphous material, a nanocrystalline material, a microcrystalline material, and a polycrystalline material have been cited, and as its material, silicon, germanium, silicon-germanium, an anisotropic conductive material, an anisotropic piezoelectric material, copper, aluminum, tantalum, and titanium have been described in Reference 2. Then, a thin-film amorphous silicon layer is formed on a surface of a glass substrate and crystallized. For providing good electrical properties, the crystallization is performed by controlling laser irradiation.

In addition, as for a technology of a step of etching a sacrifice layer for forming space, for example, there is a document on a manufacturing method of a micro-electro-mechanical device in which a first sacrifice layer member and a second sacrifice layer member are formed of different resist materials (Reference 3: Japanese Patent Laid-open No. 2004-133281). In Reference 3, by using different resist materials, the baking temperature is changed so that sacrifice layer members with different etching rates are formed.

As described in Reference 1, a microstructure body which is a component of a micromachine is formed by a process for manufacturing a semiconductor element using a silicon wafer. In particular, in order to obtain a material having a thickness and/or a strength enough for forming the microstructure body, micromachines which have been used in practice have mainly used a silicon wafer.

In addition, in order to mass-produce micromachines each having a microstructure body, it is necessary to reduce manufacturing cost. As one means thereof, there can be a method of forming a microstructure body and a semiconductor element for controlling the microstructure body over the same substrate. However, when forming a microstructure body and a semiconductor element over the same substrate, a step which is different from a manufacturing process of a semiconductor element, such as etching of a sacrifice layer is required; therefore, the process becomes complicated. As described above, manufacturing processes of a microstructure body and a semiconductor element for controlling it are different from each other and as a result, the microstructure body or the semiconductor element may be destroyed to stop functioning. Thus in manufacturing micromachines which have been used in practice, the microstructure body and the semiconductor element have been formed by different processes respectively in many cases.

SUMMARY OF THE INVENTION

According to the present invention, a microstructure body and a semiconductor element are formed over the same surface of the same substrate, and a micromachine (hereinafter referred to as a "semiconductor device" or a "micro-electro-mechanical device") having them is manufactured. In particular, the invention provides a method of simplifying a step of removing a sacrifice layer in forming the microstructure body and the semiconductor element over the same surface.

In view of the foregoing, according to the invention, in forming a pattern of a semiconductor element portion and a microstructure body portion, a sacrifice layer is formed using the same material as a mask material in an etching step, and removal of the mask in respective regions for forming the semiconductor element and for forming the microstructure body and removal of the sacrifice layer in the region for forming the microstructure body are performed by the same step.

Such a step of removing a sacrifice layer is determined by a structure and a driving method of a microstructure body. When the sacrifice layer is removed, there occurs a space so that the microstructure body partially becomes a movable portion.

Hereinafter, specific structures of the invention will be described.

One mode of the invention is a manufacturing method of a micro-electro-mechanical device, in which a sacrifice layer is selectively formed over a substrate having an insulating property (insulating substrate), a semiconductor layer is formed to cover the sacrifice layer, a mask is formed over the semiconductor layer, the semiconductor layer is etched using the mask, and the mask and the sacrifice layer are removed by the same step.

Another mode of the invention is a manufacturing method of a micro-electro-mechanical device, in which a sacrifice layer is formed in a first region over an insulating substrate, a semiconductor layer is formed to cover the sacrifice layer in the first region and a second region, a first mask and a second mask are formed in the first region and the second region respectively over the semiconductor layer, the semiconductor layer is etched using the first and second masks, a structure layer of a microstructure body and an active layer of a semiconductor element are formed as well as the sacrifice layer is partially exposed, and the first and second masks and the sacrifice layer are removed by the same step.

In any one of the above-described modes, after the semiconductor layer is formed over the sacrifice layer and the semiconductor layer is etched, a conductive layer is formed over the etched semiconductor layer, and the conductive layer is etched to form a second sacrifice layer of the microstructure body and a gate electrode of the semiconductor element.

Another mode of the invention is a manufacturing method of a micro-electro-mechanical device, in which a semiconductor layer is formed over an insulating substrate, an insulating layer is formed to cover the semiconductor layer, a sacrifice layer is selectively formed over the insulating layer, a conductive layer is formed over the sacrifice layer, a mask is formed over the conductive layer, the conductive layer is etched using the mask as well as the sacrifice layer is partially exposed, and the mask and the sacrifice layer are removed by the same step.

Another mode of the invention is a manufacturing method of a micro-electro-mechanical device, in which a semiconductor layer is formed in a first region and a second region over an insulating substrate, an insulating layer is formed to cover the semiconductor layer, a sacrifice layer is formed in the first region over the insulating layer, a conductive layer is formed over the sacrifice layer and in the second region, a mask is formed over the conductive layer, the conductive layer is etched using the mask as well as the sacrifice layer is partially exposed, and the mask and the sacrifice layer are removed by the same step.

Another mode of the invention is a manufacturing method of a micro-electro-mechanical device, in which a semiconductor layer is formed in a first region and a second region over an insulating substrate, an insulating layer is formed to cover the semiconductor layer, a sacrifice layer is formed in the first region over the insulating layer, a conductive layer is formed over the sacrifice layer and in the second region, first and second masks are formed over the conductive layer, the conductive layer is etched using the first and second masks to form a structure layer of a microstructure body and a gate electrode of a semiconductor element, as well as the sacrifice layer is partially exposed, the conductive layer is etched using the masks, and the first and second masks and the sacrifice layer are removed by the same step.

In any one of the above-described modes, the semiconductor layer includes a silicon layer crystallized using a metal. In addition, a silicide containing a metal may be formed in the semiconductor layer.

In the invention, the semiconductor layer may have a multi-layer structure of a silicon layer crystallized using a metal and an amorphous silicon layer.

In the invention, an insulating substrate may be peeled off. By peeling the substrate off, thinning in thickness and reduction in weight can be achieved.

According to the invention in which a microstructure body and a semiconductor element can be formed over the same surface of the same substrate, the process can be simplified. Consequently, improvement of production takt and reduction in cost of a micro-electro-mechanical device can be achieved, and besides, damage to the microstructure body in a manufacturing process can be reduced.

By forming a microstructure body and a semiconductor element over the same substrate as described above, a micro-electro-mechanical device which does not require assembly or packaging can be provided at low cost.

Further, according to the invention, polycrystalline silicon crystallized using a metal such as nickel (Ni) can be used for a structure layer of a microstructure body and an active layer of a semiconductor element, thereby a micro-electro-mechanical device in which a microstructure body resistant to external force or stress, and a semiconductor element superior in properties are formed over the same surface can be provided.

BRIEF DESCRIPTION OF THE DRAWINGS

FIGS. 1A-1 to 1C-2 illustrate a manufacturing method of a micro-electro-mechanical device of the invention.

FIGS. 2A-1 to 2C-2 illustrate a manufacturing method of a micro-electro-mechanical device of the invention.

FIGS. 3A-1 to 3B-2 illustrate a manufacturing method of a micro-electro-mechanical device of the invention.

FIGS. 6A-1 to 6C-2 illustrate a manufacturing method of a micro-electro-mechanical device of the invention.

FIGS. 7A-1 to 7B-2 illustrate a manufacturing method of a micro-electro-mechanical device of the invention.

FIGS. 8A-1 to 8B-2 illustrate a manufacturing method of a micro-electro-mechanical device of the invention.

DETAILED DESCRIPTION OF THE INVENTION

Figures 1, 2A:
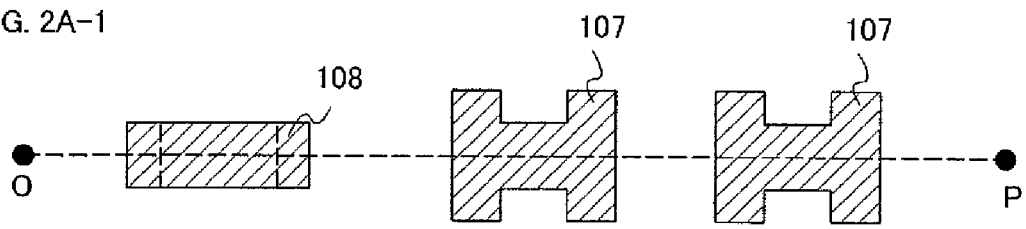

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Identical portions in the different drawings are denoted by the same reference numerals when describing a structure of the invention by using the drawings.

Embodiment Mode 1

In this embodiment mode, a method of forming a microstructure body and a semiconductor element over the same surface will be described with reference to the drawings. In the drawings, top-plan views and cross-sectional views each taken along a line O-P or Q-R are shown.

A microstructure body and a semiconductor element of the invention can be formed over the same surface of an insulating substrate. As an insulating substrate, there are a glass substrate, a quartz substrate, a plastic substrate, and the like. For example, by forming a microstructure body and a semiconductor element over a plastic substrate, a light-weight micro-electro-mechanical device having high flexibility can be manufactured. In addition, by thinning a glass substrate by polishing or the like, a thin micro-electro-mechanical device can be manufactured. Further, a substrate obtained by forming a layer having an insulating property (insulating layer) over a conductive substrate such as metal or a semiconductor substrate such as silicon may also be used as an insulating substrate.

Figures 2, 2A:
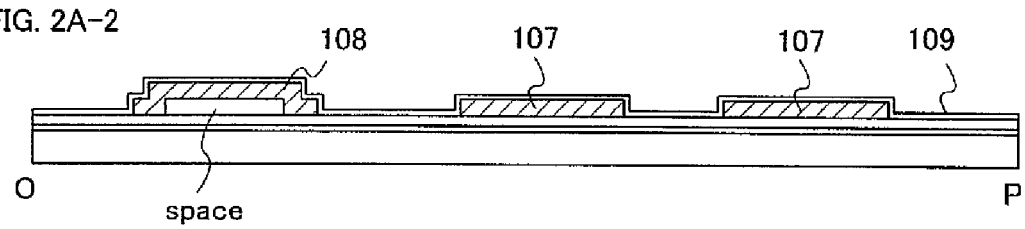

First, a base layer 102 is formed over an insulating substrate 101 (see FIGS. 1A-1 and 1A-2). The base layer 102 can be formed with a single-layer structure or a multi-layer structure by an insulating material such as silicon oxide, silicon nitride, silicon oxynitride, or silicon nitride oxide. The base layer 102 is formed with a multi-layer structure in this embodiment mode. As a first layer of the base layer 102, a layer of silicon oxynitride is formed with a thickness of 10 to 200 nm (preferably 50 to 100 nm) by plasma CVD using $SiH_4$, $NH_3$, $N_2O$, and $H_2$ as a reactive gas. In this embodiment mode, a silicon oxynitride layer with a thickness of 50 nm is formed as the first layer of the base layer 102. As a second layer of the base layer 102, a layer of silicon oxynitride is formed with a thickness of 50 to 200 nm (preferably 100 to 150 nm) by plasma CVD using $SiH_4$ and $N_2O$ as a reactive gas. In this embodiment mode, a silicon oxynitride layer with a thickness of 100 nm is formed as the second layer of the base layer 102.

Next, a first sacrifice layer 103 is formed over the base layer 102 and is etched into a predetermined shape (see FIGS. 1A-1 and 1A-2). For the first sacrifice layer 103, a resin material such as epoxy resin, acrylic resin, phenol resin, novolac resin, melamine resin, or urethane resin is used. Alternatively, the following may also be used: an organic material such as benzocyclobutene, parylene, arylene ether fluoride, or light-transmitting polyimide; a compound material made by polymerization of siloxane-based polymer or the like; a composition material containing water-soluble homopolymer and water-soluble copolymer; or the like. Note that siloxane corresponds to a resin including a Si—O—Si bond, and is a resin including a skeleton structure formed by a bond of silicon (Si) and oxygen (O). As a substituent, an organic group containing at least hydrogen (e.g., an alkyl group or aromatic hydrocarbon) is used. Alternatively, a fluoro group may be used as the substituent. Further alternatively, both of an organic group containing at least hydrogen and a fluoro group may be used as the substituents.

For the first sacrifice layer 103, a resist material containing a photosensitizing agent may also be used. For example, a typical positive resist such as a novolac resin and a photosensitive agent such as a naphthoquinonediazide compound; a negative resist such as a base resin; or a photosensitive resin containing diphenylsilanediol, an acid generating material or the like can be used.

Surface tension and viscosity of any material are determined by controlling a concentration of a solvent into which the material is mixed or by adding surfactant or the like. For example, by adding surfactant, surface tension of the solvent can be reduced.

A film is formed using the above-described material and etched into a predetermined shape to form the first sacrifice layer 103. Photolithography can be used for the etching. Alternatively, a mask may be drawn with a droplet ejecting apparatus such as an ink-jet apparatus and the mask may be used for the etching of the first sacrifice layer 103. By drawing a mask with a droplet ejecting apparatus as described above, steps of exposure and development required for photolithography can be omitted, and waste of a mask material can be eliminated.

Thickness of the first sacrifice layer 103 is determined in consideration of a material of the first sacrifice layer 103, a structure and a driving method of a structure body, a method of etching the sacrifice layer, and the like. For example, if the first sacrifice layer 103 is too thin, an etching agent does not diffuse so that such a phenomenon that the first sacrifice layer 103 is not etched or a structure layer buckles after being etched, occurs.

In addition, in the case where the structure body is driven by electrostatic attraction (hereinafter referred to as "electrostatic force"), it cannot be operated if the first sacrifice layer is too thick. For example, in the case where the structure body is operated by electrostatic force generated between the lower conductive layer and the structure layer, the thickness of the first sacrifice layer 103 may be set in the range of 0.5 μm to 3 μm, and may be preferably set at 1 μm to 2.5 μm.

Next, a semiconductor layer 104 is formed over the base layer 102 and the first sacrifice layer 103. The semiconductor layer 104 corresponds to an active layer for structuring a semiconductor element and a structure layer for structuring a microstructure body. Note that the active layer includes a channel formation region, a source region, and a drain region. The semiconductor layer 104 can be formed of a material containing silicon as a main component or a material containing silicon, e.g., a silicon germanium material containing about 0.01 to 4.5 atomic % of germanium. Moreover, for the semiconductor layer 104, a material having either a crystalline structure or an amorphous structure is used.

Then, a mask 105 is formed in a predetermined region over the semiconductor layer 104 (see FIGS. 1B-1 and 1B-2). The mask 105 is formed into a predetermined shape, for example by performing exposure and development to form an active layer and a structure layer after a resist agent is applied.

In the invention, the mask 105 is formed of either the same material as the first sacrifice layer 103 or a material which can be treated at the same time in a later step of removing a mask. The semiconductor layer 104 is etched using the mask 105 to form an active layer 107 and a structure layer 108 (see FIGS. 1C-1 and 1C-2). In this time, the first sacrifice layer 103 is partially exposed.

Subsequently, the first sacrifice layer 103 and the mask 105 are removed at the same time (see FIGS. 2A-1 and 2A-2). In the invention, the first sacrifice layer 103 and the mask 105 are formed of the same material or materials which can be treated by the same step respectively. Treatment time is arbitrarily controlled so as to be able to remove the first sacrifice layer 103 and the mask 105 by the same step. Consequently, the first sacrifice layer 103 and the mask 105 can be removed by the same step. A space is formed by removing the first sacrifice layer 103. Owing to existence of this space, a part of a microstructure body becomes a movable portion.

Note that a sacrifice layer means a layer to be removed for forming space required for a microstructure body, and may be either a conductive layer or an insulating layer.

As set forth above, removal of the mask 105 and removal of the first sacrifice layer 103 are performed by the same step according to the invention. As a result, a step only for removing the sacrifice layer can be omitted, and damage to the structure layer 108 and the active layer 107 can be reduced.

Material and thickness of the structure layer 108 are determined in consideration of various factors such as the thickness and material of the first sacrifice layer 103, a structure of a structure body, and a method of etching the sacrifice layer. For example, if a material having a large difference in distribution of internal stress is used for the structure layer 108, the structure layer 108 may curve. However, a structure body can also be formed by utilizing this curve of the structure layer 108. In addition, if the structure layer 108 is formed thick, internal stress may be distributed therein, which causes a curve or buckling. In view of the foregoing, the structure layer 108 may be preferably formed with a thickness of 0.5 μm to 10 μm.

Although the semiconductor layer which corresponds to the active layer 107 and the structure layer 108 is formed over the first sacrifice layer 103 in this embodiment mode, the semiconductor layer may also be formed after an insulating layer is formed over the first sacrifice layer 103. By using such a step, the structure layer 108 is protected by the insulating layer in removing the first sacrifice layer 103, thereby damage to the structure layer 108 can be reduced.

Next, an insulating layer 109 (first insulating layer) covering the top face of the structure layer 108 is formed over the active layer 107 and the structure layer 108 (see FIGS. 2A-1 and 2A-2). The insulating layer 109 functions as a gate insulating layer of a semiconductor element. The insulating layer 109 can be formed, similarly to the base layer 102, by plasma CVD, sputtering, or the like using a material containing silicon such as silicon oxide or silicon nitride. Either a single-layer structure or a multi-layer structure may be employed. In this embodiment mode, a silicon oxynitride film (composition ratio: Si=32%, O=59%, N=7%, and H=2%) is formed with a thickness of 115 nm by plasma CVD as the insulating layer 109.

Further, as a material of the insulating layer 109, a metal oxide having a high dielectric constant, e.g., hafnium (Hf) oxide can also be used. By using such a high dielectric constant material to form the gate insulating layer, the semiconductor element can be driven at low voltage; thus, a micro-electro-mechanical device with low power consumption can be provided.

Further, the insulating layer 109 is formed by high-density plasma treatment. High-density plasma treatment is a plasma treatment in which the plasma density is $1 \times 10^{11}$ cm$^{-3}$ or more, and is preferably in the range of $1 \times 10^{11}$ cm$^{-3}$ to $9 \times 10^{15}$ cm$^{-3}$ and a high frequency such as a microwave (e.g., frequency: 2.45 GHz) is used. When plasma is generated in such conditions, the low electron temperature would be 0.2 eV to 2 eV. Thus, by high density plasma, the feature of which is low electron temperature, a film can be formed with low plasma damage and almost no defect because kinetic energy of the active species is low.

A substrate provided with the active layer 107 and the structure layer 108 is installed in a film formation chamber capable for such plasma treatment, and distance between an electrode for generating plasma, a so-called antenna, and an object to be formed is set at 20 mm to 80 mm, and preferably 20 mm to 60 mm to perform the treatment. Such high-density plasma treatment allows a low temperature process in which the substrate temperature is 400° C. or less. Accordingly, glass or plastic having low thermostability can be used for the insulating substrate 101.

A film formation atmosphere when such high-density plasma is used may be a nitrogen atmosphere or an oxygen atmosphere. A nitrogen atmosphere is typically a mixed atmosphere of nitrogen and rare gas, or a mixed atmosphere of nitrogen, hydrogen, and rare gas. At least one of helium, neon, argon, krypton, and xenon is used as the rare gas. Further, an oxygen atmosphere is typically a mixed atmosphere of oxygen and rare gas, a mixed atmosphere of oxygen, hydrogen, and rare gas, or a mixed atmosphere of dinitrogen monoxide and rare gas. At least one of helium, neon, argon, krypton, and xenon is used as the rare gas.

An insulating layer formed by such high-density plasma treatment is dense and causes little damage to other films when forming the insulating layer. Further, the state of an interface to be in contact with the insulating layer can be improved. For example, when the gate insulating layer is formed by high-density plasma treatment, the state of an interface with the semiconductor layer can be improved. Accordingly, electrical properties of the semiconductor element can be improved. In addition, when the insulating layer is formed over the structure layer as described above, damage to the structure layer can be reduced in forming the insulating layer, and mechanical strength of the structure layer 108 can be prevented from deteriorating.

Although the case where high-density plasma treatment is used for forming the insulating layer 109 is described herein, high-density plasma treatment may also be performed to the semiconductor layer. Owing to the high-density plasma treatment, the surface of the semiconductor layer can be reformed, so that the interface state can be improved and electrical properties of the semiconductor element can be improved.

In addition, high-density plasma treatment can be used not only for forming the insulating layer 109 but also for forming the base layer 102 and another insulating layer.

Figures 1, 2B:
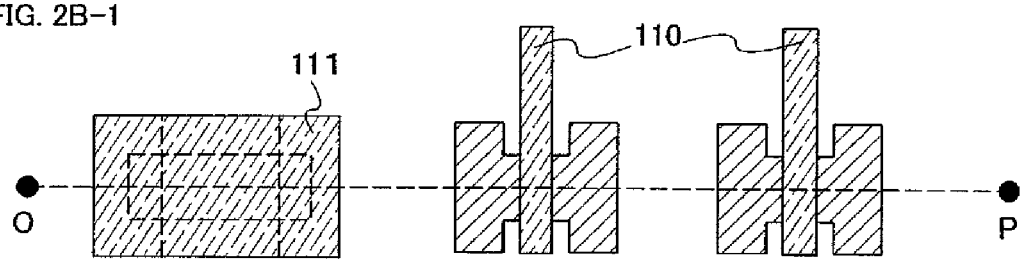
Figures 2, 2B:
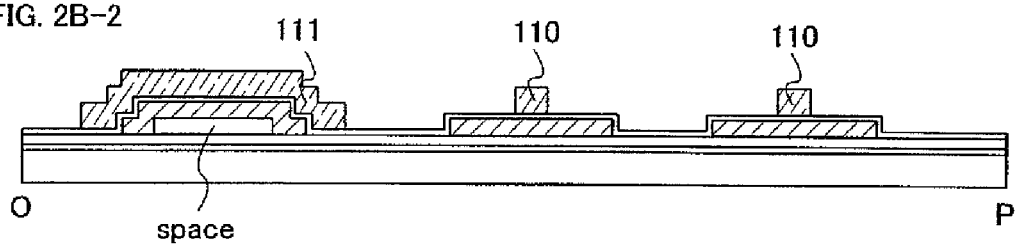

Next, a first conductive layer 110 which functions as a gate electrode of a semiconductor element, and a second sacrifice layer 111 of a microstructure body are formed over the insulating layer 109 (see FIGS. 2B-1 and 2B-2). The first conductive layer 110 is formed by CVD, sputtering, or the like, and etched to be a predetermined shape. Alternatively, it may also be formed by a droplet ejecting method using a composition containing a conductive material. As the conductive material, a metal such as Ag, Au, Cu, Ni, Pt, Pd, Ir, Rh, W, Al, Ta, Mo, Cd, Zn, Fe, Ti, Zr, or Ba; a semiconductor such as Si or Ge; ITO (Indium Tin Oxide); ITSO which contains silicon oxide as a composition; IZO that is indium zinc oxide; organoindium; organotin; zinc oxide (ZnO); tin nitride (TiN); or the like can be used. Note that indium zinc oxide (IZO) is a transparent conductive material which is formed by sputtering using a target obtained by mixing 2 to 20 wt % of zinc oxide (ZnO) into indium tin oxide (ITO). In addition, in the case of forming by a droplet ejecting method, a solvent into which the above-described metal, a dispersive nanoparticle, a silver halide particle, or the like can be used. By employing the droplet ejecting method, steps of exposure and development required for photolithography can be omitted, thereby the process can be simplified.

An end face of the first conductive layer 110 or the second sacrifice layer 111 may be etched into a taper shape. By shaping the end face to be a taper, good covering with a film which is formed in the following step can be achieved. In addition, either a single-layer structure or a multi-layer structure can be employed for the first conductive layer 110 and the second sacrifice layer 111.

Figures 1, 2C:
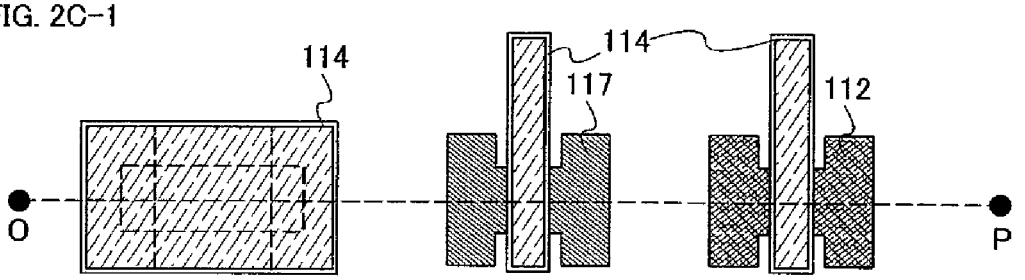
Figures 2, 2C:
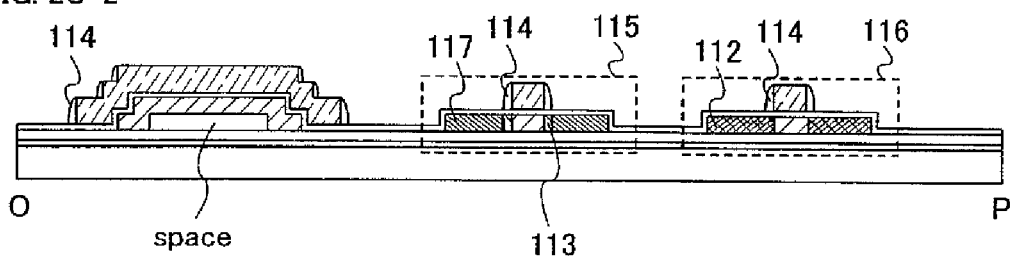

Then, impurity elements are added into the active layer 107 for structuring a semiconductor element so that an N-type impurity region 113 and a P-type impurity region 112 are formed (see FIGS. 2C-1 and 2C-2). Such an impurity region can be selectively formed by forming a mask by photolithography and adding an impurity element. As the method for adding an impurity element, a method using thermal diffusion or an ion implantation method can be used. As an impurity element which imparts N-type conductivity, phosphorus (P) or arsenic (As) can be typically used and as an impurity element which imparts P-type conductivity, boron (B) can be typically used. It is preferable that respective impurity elements are added into the N-type impurity region 113 and the P-type impurity region 112 at a concentration range of $1\times10^{20}$ to $1\times10^{21}/\text{cm}^3$.

Next, an insulating layer is formed of a nitride compound such as silicon nitride or an oxide such as silicon oxide by plasma CVD or the like, and anisotropically etched in a perpendicular direction so that a sidewall 114, which functions as an insulating layer, is formed in contact with a side face of the first conductive layer 110 (see FIGS. 2C-1 and 2C-2). At this time, the sidewall 114 is also formed at a side face of the second sacrifice layer 111; in order not to form the sidewall 114, a mask to cover the second sacrifice layer 111 is formed in advance before the sidewall 114 is formed.

Then, an impurity element is added into the active layer 107 including the N-type impurity region 113, to form a high-concentration N-type impurity region 117 where the impurity concentration is higher than in the N-type impurity region 113 which is provided under the sidewall 114.

The reason why two kinds of impurity regions having different concentrations are formed as described above is to avoid short-channel effect. Short-channel effect means such a phenomenon that leakage current flows between a source and a drain even when no voltage is applied to a gate because of short gate length. The two regions having different concentrations are formed only in an N-type semiconductor element herein; this is because an N-type semiconductor element is more easily affected by short-channel effect. Needless to say, a sidewall may be formed and a high-concentration P-type impurity region may be formed in a P-type semiconductor element as well.

In addition, in the case where the first conductive layer 110 has a multi-layer structure with different conductive materials and has a taper shape, the N-type impurity region 113 and the high-concentration N-type impurity region 117 can also be formed by adding an impurity element once without providing a sidewall.

After the impurity regions are formed, thermal treatment, infrared light irradiation, or laser irradiation may be performed in order to activate the impurity elements. Furthermore, at the same time as the activation, plasma damage to the insulating layer 109 and the interface between the insulating layer 109 and the active layer 107 due to plasma damage can be restored. In particular, effective activation can be performed when the impurity elements are activated using an excimer laser from the front surface or from the back in an atmosphere under room temperature to 300° C. Further, a higher harmonic such as a second harmonic of a YAG laser may be used for the activation. The irradiation using a YAG laser is preferable because maintenance of the YAG laser is not so frequently required.

Further, a passivation film of an insulator such as silicon oxynitride or silicon oxide may be formed to cover the first conductive layer 110 and the semiconductor layer. After that, thermal treatment, infrared light irradiation, or laser irradiation may be performed to conduct hydrogenation. For example, a silicon oxynitride film is formed by plasma CVD, and then heated using a clean oven at 300° C. to 550° C. for 1 to 12 hours, thereby hydrogenating the semiconductor layer. Owing to this step, dangling bonds in the semiconductor layer which are generated when the impurity elements are added can be terminated by hydrogen contained in the passivation film. At the same time, the activation treatment of the above-described impurity regions can be performed.

Through the above-described steps, an N-type semiconductor element 115 and a P-type semiconductor element 116 are formed (see FIGS. 2C-1 and 2C-2). In this time, in the structure layer 108 for structuring a microstructure body, an impurity region is formed in a region which is not covered with the second sacrifice layer 111.

Subsequently, an interlayer insulating layer 118 (second insulating layer) is formed to cover the entire surface (see FIGS. 3A-1 and 3A-2). The interlayer insulating layer 118 can be formed of a material having an insulating property. Either an inorganic material or an organic material can be used. As the inorganic material, silicon oxide, silicon nitride, or the like can be used. As the organic material, polyimide, acrylic, polyamide, polyimide amide, a resist, benzocyclobutene, siloxane, or polysilazane can be used. Note that polysilazane is formed using a polymer material having a bond of silicon (Si) and nitrogen (N) as a starting material.

Figures 1, 3A:
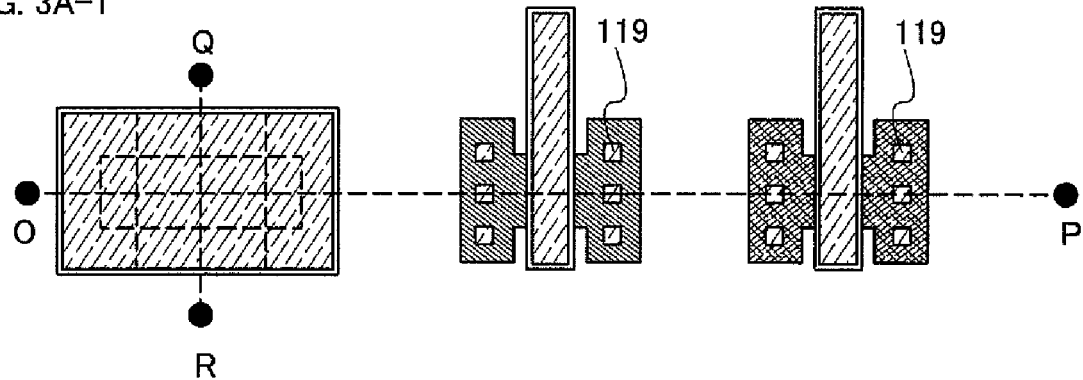
Figures 2, 3A:
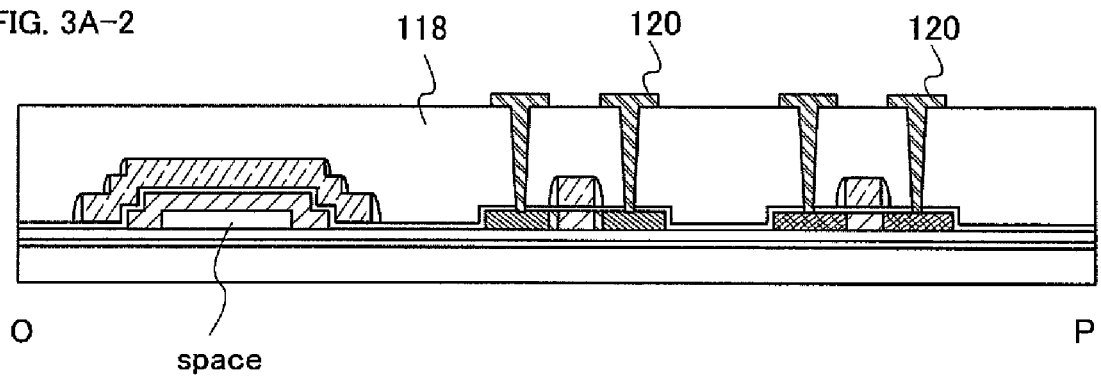

Next, the interlayer insulating layer 118 and the insulating layer 109 are sequentially etched to form a contact hole 119 (see FIGS. 3A-1 and 3A-2). Either dry etching or wet etching can be used for the etching. In this embodiment mode, the contact hole 119 is formed by dry etching.

Next, a second conductive layer 120, which functions as a source electrode or a drain electrode, is formed over the interlayer insulating layer 118 and in the contact hole 119 (see FIGS. 3A-1 and 3A-2). In this time, a wiring for structuring an electrical circuit can be formed.

The conductive layer can be formed with a film of aluminum (Al), titanium (Ti), molybdenum (Mo), tungsten (W), or silicon (Si), or a film of a conductive material made of an alloy using any of the above-mentioned elements. A composition containing such a conductive material is ejected by a droplet ejecting method to form the second conductive layer 120. Alternatively, a film may be formed of the above-mentioned conductive material by sputtering or CVD and then etched into a predetermined shape to form the second conductive layer 120.

In addition, when the second conductive layer 120 has a pattern with a corner when seen from the top, it is preferably etched such that the corner has roundness. Accordingly, occurrence and accumulation of dust can be suppressed, thus the yield can be improved. This is similarly applied to the case of etching another conductive layer such as the first conductive layer 110.

Figures 1, 3B:
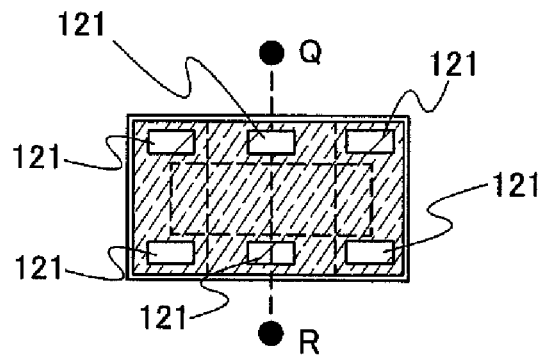
Figures 2, 3B:
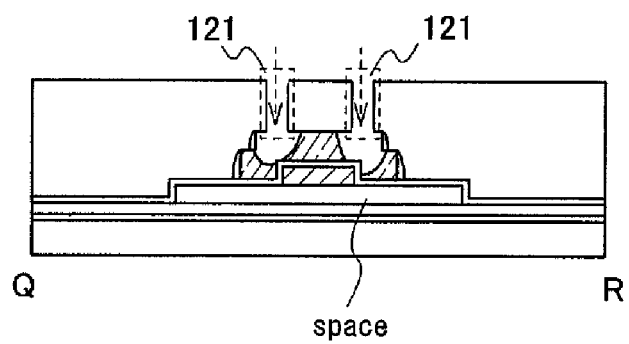

Next, the interlayer insulating layer 118 is etched to form an opening portion 121. Consequently, the second sacrifice layer 111 is exposed (see FIGS. 3B-1 and 3B-2). Either dry etching or wet etching can be used for the etching. Note that only a microstructure body is shown in FIGS. 3B-1 and 3B-2.

In this embodiment mode, the opening portion 121 is formed by dry etching. The opening portion 121 is provided in order to etch away the second sacrifice layer 111. Therefore, it is necessary to determine the diameter of the opening portion 121 appropriately such that an etching agent flows in. For example, the diameter of the opening portion 121 is preferably 2 μm or more.

Further, the opening portion 121 can be formed larger for etching the second sacrifice layer 111 easily. That is, it is not necessarily formed small unlike that described above, and the opening portion 121 may be formed so as to expose the second sacrifice layer 111 entirely while leaving a portion requiring the interlayer insulating layer 118 (e.g., a portion over a semiconductor element). In addition, by forming a plurality of opening portions 121, removal of the second sacrifice layer 111 can be performed in shorter time.

Figure 4A:
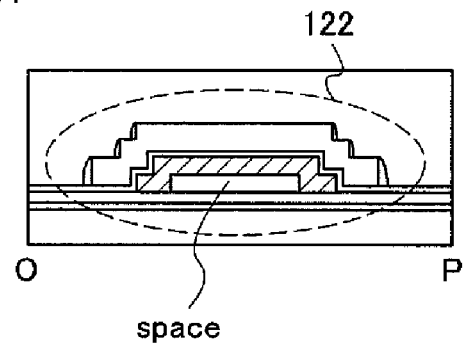
FIGS. 4A to 4C illustrate a manufacturing method of a micro-electro-mechanical device of the invention.
Figure 4B:
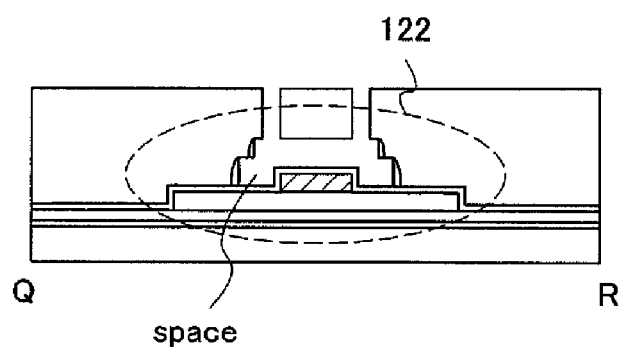

Next, the second sacrifice layer 111 is removed by etching (see FIGS. 4A and 4B). Note that only microstructure bodies taken along O-P and Q-R are shown in FIGS. 4A and 4B respectively. Either dry etching or wet etching can be used for the etching, depending on the material of the second sacrifice layer 111. By injecting an etchant or an etching gas into the opening portion 121, the second sacrifice layer 111 can be etched away.

For example, the second sacrifice layer 111 which is formed of tungsten (W) can be removed by soaking in a solution in which 28 wt % of ammonia and 31 wt % of oxygenated water are mixed at a ratio of 1:2. The treatment time can be arbitrarily controlled depending on the film thickness or the like. The second sacrifice layer 111 which is formed of silicon dioxide can be removed by using buffered hydrofluoric acid in which 49 wt % hydrofluoric acid solution and ammonium fluoride are mixed at a ratio of 1:7. The second sacrifice layer 111 which is formed of silicon can be removed by using phosphoric acid; a hydroxide of an alkali metal such as KOH, NaOH, or CsOH; $NH_4OH$; hydrazine; EPD (a mixture of ethylenediamine, pyrocatechol, and water); a solution of TMAH, IPA, or NMD3; or the like. In drying after wet etching, rinsing is performed using a low viscosity organic solvent (e.g., cyclohexane); drying is performed under conditions of low temperature and low pressure; or both of the rinsing and drying described above are performed; thus, the microstructure body can be prevented from buckling due to capillary action.

Further, the second sacrifice layer 111 can also be removed by dry etching using $F_2$ or $XeF_2$ under a condition of high pressure such as atmospheric pressure. In addition, in order to prevent the microstructure body from buckling due to capillary action, the surface of the microstructure body may be treated with plasma to be water repellent.

Figure 4C:
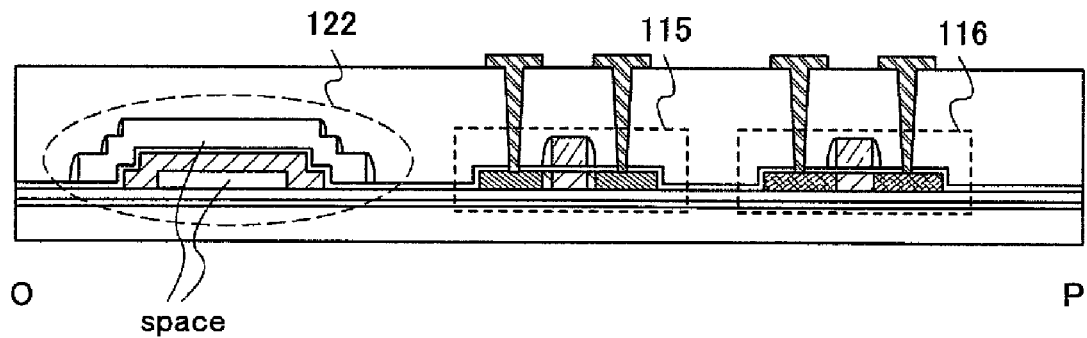

By etching away the second sacrifice layer 111 through the above-described steps, a space is formed and a microstructure body 122 is formed. Accordingly, the microstructure body 122, the N-type semiconductor element 115, and the P-type semiconductor element 116 can be formed over the same surface (see FIG. 4C). By forming the microstructure body and the semiconductor element over the same surface of the same substrate, a micro-electro-mechanical device which does not require assembly or packaging can be provided at lower cost.

In the method of forming the microstructure body 122 described above, it is necessary to select appropriate combination of the material of the structure layer 108, the material of the first sacrifice layer 103, the material of the second sacrifice layer 111, and an etching agent for removing the sacrifice layers. For example, in the case of using a certain etching agent, the first sacrifice layer 103 and the second sacrifice layer 111 may be formed using a material having a higher etching rate than that of the material of the structure layer 108.

Embodiment Mode 2

In the invention, a semiconductor layer having either a crystalline structure or an amorphous structure can be applied for the structure layer. Described in this embodiment mode will be the case where the structure layer is a crystalline silicon layer.

First, an amorphous silicon layer is formed over a surface for forming a structure layer. Then thermal treatment is performed to crystallize the amorphous silicon layer, thereby a crystalline silicon layer can be obtained. A heating furnace, laser irradiation, irradiation with light emitted from a lamp in place of laser light (hereinafter referred to as "lamp annealing"), or a combination thereof can be employed for the thermal treatment.

A continuous wave laser beam (hereinafter referred to as a "CW laser beam") or a pulsed wave laser beam (hereinafter referred to as a "pulsed laser beam") can be used in the case of the laser irradiation: one of or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. Crystals having a large grain size can be obtained by irradiation with a laser beam of a fundamental wave of the above laser beam or a second harmonic to a fourth harmonic of the fundamental wave. For example, a second harmonic (532 nm) or a third harmonic (355 nm) of an $Nd:YVO_4$ laser (fundamental wave: 1064 nm) can be used. Energy density of the laser at this time needs to be in the range of about 0.01 $MW/cm^2$ to 100 $MW/cm^2$ (preferably, 0.1 $MW/cm^2$ to 10 $MW/cm^2$). The laser irradiation is performed at scanning speed of about 10 cm/sec to 2000 cm/sec. Note that a laser beam includes laser light in this specification.

Note that the amorphous silicon layer may be irradiated with a continuous wave laser beam at a fundamental wave and a continuous wave laser beam at a higher harmonic, or may be irradiated with a continuous wave laser beam at a fundamental wave and a pulsed wave laser beam at a higher harmonic. Energy can be supplemented by irradiating with plural kinds of laser beams.

Further, in the case of a pulsed wave laser, pulsed laser may be oscillated with such a repetition rate that the laser of the next pulse is emitted until the semiconductor film is solidified after the semiconductor film is melted. By oscillating the laser with such a repetition rate, crystal grains that are continuously grown in the scanning direction can be obtained. Specifically used is a laser beam with a repetition rate of 10 MHz or more which is much higher than the repetition rate band of several tens to several hundreds Hz which is normally used.

Alternatively, in the case of using a heating furnace for the thermal treatment, the amorphous silicon layer is heated at a temperature of 400 to 550° C. for 2 to 20 hours. At this time, the temperature may be set in stages in the range of 400 to 550° C. so as to be gradually increased. Since hydrogen or the like of the amorphous silicon layer is released by the first low-temperature heating step at about 400° C., film roughness in crystallization can be reduced. In addition, a metal element which accelerates crystallization, e.g., Ni, may be formed over the amorphous silicon layer, which is preferable in that the heat temperature can be lowered. As the metal element, Fe, Ru, Rh, Pd, Os, Ir, Pt, Cu, Au, or the like can also be used.

Further, in addition to the thermal treatment, irradiation with the above-described laser beam may be performed to form a crystalline silicon layer.

Polycrystalline silicon which has been crystallized using such a metal has the approximately same crystal structure as is in the case of using a single crystal, ductility of which can be higher than that of polycrystalline silicon which is formed by crystallization without a metal. This is because crystal grain boundaries of polycrystalline silicon become continuous due to the crystallization using a metal. The polycrystalline silicon in which crystal grain boundaries are continuous has such a structure that covalent bonds are not broken at grain boundaries, unlike polycrystalline silicon obtained by crystallization without a metal. Accordingly, stress concentration which is caused by defects due to grain boundaries, which occurs in the polycrystalline silicon obtained by crystallization without a metal, does not occur. As a result, fracture stress becomes higher than that of the polycrystalline silicon formed by crystallization without a metal.

Polycrystalline silicon where crystal grain boundaries are continuous exhibits a high-electron mobility, which is suitable as the material in the case where a microstructure body is controlled by electrostatic force. Furthermore, the structure layer contains a metal element which accelerates crystallization, and has a conductive property; therefore, it is suitable for a micro-electro-mechanical device of the invention in which a structure body is controlled by electrostatic force. Needless to say, a polycrystalline silicon layer which is formed without a metal may be applied to a structure layer in the case where the microstructure body is controlled by electromagnetic force.

In addition, when nickel is used as the metal, nickel silicide can be formed in a silicon layer. It is generally known that a silicon alloy such as nickel silicide exhibits high mechanical strength. Therefore, by selectively leaving the metal used in the thermal treatment in the entire or a part of the silicon layer and applying appropriate thermal treatment, a microstructure body with more hardness and a higher conductive property can be formed.

By stacking a layer having nickel silicide in which a metal used in the crystallization remains (nickel silicide layer) as described above and a polycrystalline silicon layer, a structure layer which is superior in the conductive property and is flexible can be obtained. In addition, by stacking an amorphous silicon layer and a nickel silicide layer, a hard layer which is superior in the conductive property can be obtained.

Such a silicide layer can also be formed by tungsten, titanium, molybdenum, tantalum, cobalt, or platinum as well as nickel. They correspond to a tungsten silicide layer, a titanium silicide layer, a molybdenum silicide layer, a tantalum silicide layer, a cobalt silicide layer, and a platinum silicide layer respectively. Among them, cobalt or platinum can also be used as a metal for reducing the heat temperature.

The structure layer 108 formed through the above-described steps can be used with a state having a metal.

However, since the metal for accelerating crystallization is a contaminant for a micro-electro-mechanical device, it may be preferably removed after the crystallization. In this case, after crystallization by thermal treatment or laser irradiation, a layer to be a gettering sink is formed over the silicon layer and heated, thereby moving the metal element into the gettering sink. A semiconductor layer into which an impurity is added or a polycrystalline semiconductor layer can be used as the gettering sink. For example, a polycrystalline semiconductor layer into which an inert element such as argon can be formed over the semiconductor layer to use as a gettering sink. By adding an inert element, distortion can be generated in the polycrystalline semiconductor layer, and a metal element can be efficiently captured by the distortion. Alternatively, the metal can be captured by forming a semiconductor layer into which another element such as phosphorus is added.

In the case where the conductive property is required for the structure layer, an impurity element such as phosphorus (P), arsenic (As), or boron (B) can also be added after the metal is removed. A structure body having a conductive property is suitable for a micro-electro-mechanical device of the invention which is controlled by electrostatic force.

A structure layer as described above may be formed with a multi-layer structure in order to obtain a required thickness. For example, a polycrystalline silicon layer can be formed with a multi-layer structure by repeating formation of an amorphous silicon layer and crystallization by thermal treatment. By this thermal treatment, a stress in the polycrystalline silicon layer which has been formed before is alleviated, thereby peeling of a film and deformation of a substrate can be prevented. Further, in order to further alleviate the stress in the film, etching of the silicon layer may also be included in the step, then the step can also be repeated. Such a forming method by the step including etching is suitable for the case where a material having a large internal stress is used for a structure layer.

In the case where crystallization is performed by using a metal as described above, the crystallization can be performed at a lower temperature as compared to crystallization without a metal, therefore, a substrate for structuring a microstructure body can have more choices in its kind. For example, in the case where a semiconductor layer is crystallized only by heat, it is required that the layer is heated at about 1000° C. for about one hour, thus a glass substrate cannot be used. However, by crystallizing using the above-mentioned metal as in this embodiment mode, a glass substrate of which distortion point is 593° C. can be used.

Embodiment Mode 3

In the case where the microstructure body 122 is driven by electrostatic force, it is preferable to form a bottom electrode which can be used as a common electrode, a control electrode, or the like, under the base layer. Described in this embodiment mode will be a micro-electro-mechanical device having a bottom electrode.

Figure 9:
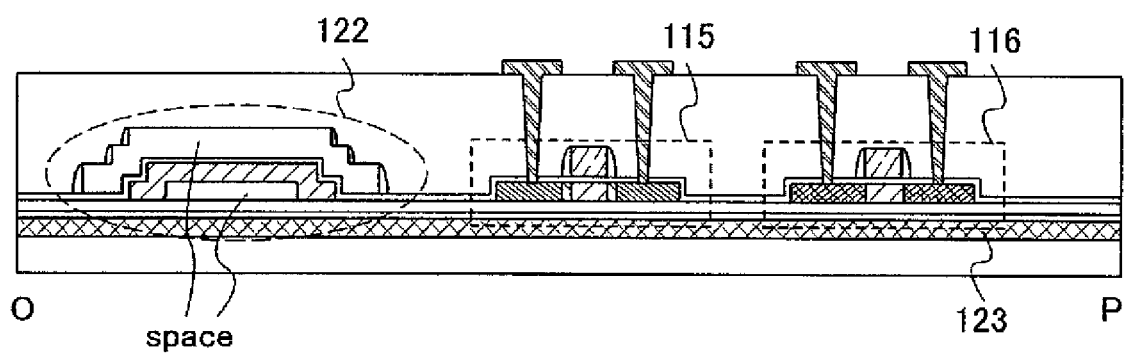
FIG. 9 illustrates one mode of a micro-electro-mechanical device of the invention.

In the case where the microstructure body 122 is driven by electrostatic force, it is preferable to form a conductive layer 123 which can be used as a common electrode, a control electrode, or the like, under the base layer 102 (see FIG. 9). If the base layer 102 is formed with a multi-layer structure, the conductive layer 123 can also be formed between layers of the base layer 102. The conductive layer 123 is formed by CVD or the like using a metal such as tungsten or a conductive substance. Further, the conductive layer 123 may be etched into a predetermined shape as needed to form a pattern.

This embodiment mode can be freely combined with any of Embodiment Modes 1 and 2.

Embodiment Mode 4

In the invention, silicon or silicon compounds having various properties can be stacked for the microstructure body. Silicon layers having various properties are different in properties such as strength depending on whether the crystal structure is any structure of amorphous, microcrystal, poly crystal, or the like. Further, in the case of polycrystal, a silicon layer thereof is different in properties due to the crystal direction. Described in this embodiment mode will be a structure example of a semiconductor layer used for the structure layer.

Figure 5A:
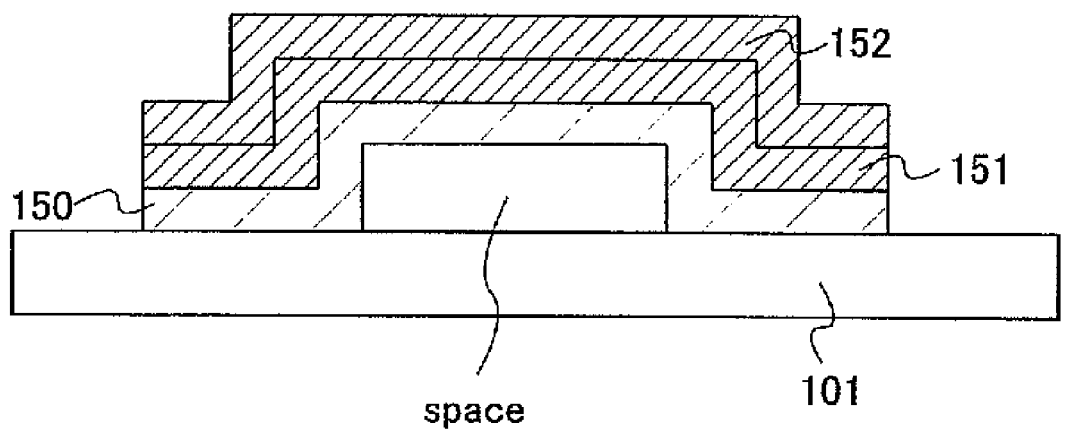
FIGS. 5A and 5B illustrate a manufacturing method of a micro-electro-mechanical device of the invention.
Figure 5B:
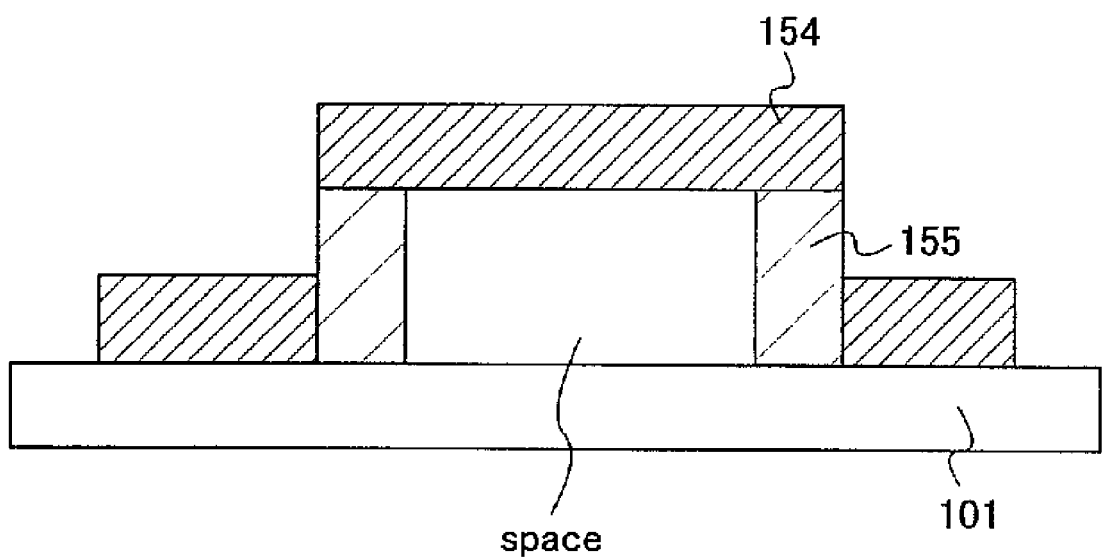

As shown in FIGS. 5A and 5B, silicon or silicon compounds which are different in a crystal structure can be stacked. FIG. 5A illustrates the case where an amorphous silicon layer 150, a polycrystalline silicon layer 151, and a layer containing nickel silicide 152 are stacked over the insulating substrate 101. In this invention, layers for structuring the structure body can be chosen and stacked. In addition, since the multi-layer structure can be easily formed, the structure layer 108 having desired properties can also be formed easily.

It is generally known that silicon alloy such as nickel silicide generally exhibits high mechanical strength. By selectively leaving a metal used in crystallization of the semiconductor layer in the entire or a part of the semiconductor layer and applying appropriate thermal treatment, a structure body with high mechanical strength and a high conductive property can be formed.

The crystallization using a metal as described above can also be partially performed by selectively applying the metal. For example, the metal can be applied only to a portion of the structure layer 108, under which the first sacrifice layer 103 is provided, and crystallized.

The above-described crystallization can also be partially performed by selectively irradiating with a laser beam. For example, only a portion 154 of the structure layer 108, under which the first sacrifice layer 103 is provided, can be crystallized. Furthermore, as shown in FIG. 5B, by changing the irradiation condition of a laser beam, amorphous silicon remains only in a column portion 115 of the beam structure while crystallizing a joist portion thereof.

By crystallizing partially as described above, various materials can be combined. For example, ductility can be improved only by crystallizing only a driving portion.

As another structure layer, a layer containing polycrystalline silicon and a layer containing amorphous silicon as described in Embodiment Mode 2 can be stacked.

Further, by stacking a layer containing polycrystalline silicon with a metal left and a layer containing polycrystalline silicon, a flexible material which is superior in conductive property can be obtained.

Further, a layer containing amorphous silicon and a layer containing silicide may also be stacked. As a result, superior conductive property and hardness can be provided.

Note that balance between flexibility and hardness can be determined by a ratio of respective thicknesses of the stacked layers. This is because destruction, which occurs from a crystal defect of an amorphous silicon layer, would be stopped by a polycrystalline silicon layer because the polycrystalline silicon layer having high crystallinity does not propagate destruction easily.

Further, crystal growth of silicon proceeds in a perpendicular direction with respect to a substrate when laser crystallization is performed using a metal, whereas crystal growth of silicon proceeds in a parallel direction with respect to a substrate when laser crystallization is performed without a metal. By stacking two or more layers of respective layers formed by both the laser crystallization, a material which is further superior in ductility can be obtained. Since layers having different crystal directions are stacked, if a crack or the like occurs in one layer, the crack does not easily propagate the other layer having a different crystal direction; accordingly, the structure layer 108 with high strength can be formed.

The amorphous silicon layer, the polycrystalline silicon layer, or the layer containing nickel silicide as described above can also be stacked by repeating film formation, in order to provide a necessary thickness. For example, formation of a layer containing amorphous silicon and heating may be repeated; furthermore, etching may also be included to be repeated, in order to further alleviate stress within a film. The film formation and the crystallization can be combined by freely selecting among the above-described examples.

By stacking semiconductor layers as described above, a structure layer having both flexibility and hardness can be obtained.

This embodiment mode can be freely combined with any of Embodiment Modes 1 to 3.

Embodiment Mode 5

In this embodiment mode, a method for forming a microstructure body and a semiconductor element over the same surface, which is different from Embodiment Mode 1 will be described with reference to the drawings. In each of the drawings, a top-plan view is shown above and a cross-sectional view taken along O-P or Q-R in the top-plan view is shown below.

First, a base layer 202 is formed over an insulating substrate 201, similarly to Embodiment Mode 1 (see FIGS. 6A-1 and 6A-2).

Next, a semiconductor layer 203 for structuring a microstructure body and an active layer 204 for structuring a semiconductor element are formed and etched into a predetermined shape (see FIGS. 6A-1 and 6A-2). The semiconductor layer 203 and the active layer 204 can be formed similarly to Embodiment Mode 1. In addition, for the semiconductor layer 203 and the active layer 204, amorphous silicon or crystalline silicon can be used.

Next, an insulating layer 205 (first insulating layer) is formed over the semiconductor layer 203 and the active layer 204 similarly to Embodiment Mode 1 (see FIGS. 6A-1 and 6A-2). The insulating layer 205 servers as a gate insulating layer of a semiconductor element. Further, the insulating layer or the like can be formed by high-density plasma treatment similarly to Embodiment Mode 1.

Subsequently, a first sacrifice layer 206 is formed over the semiconductor layer 203 for structuring a microstructure body and etched into a predetermined shape (see FIGS. 6B-1 and 6B-2). The first sacrifice layer 206 is formed of a resin material such as epoxy resin, acrylic resin, phenol resin, novolac resin, melamine resin, or urethane resin can be used. Alternatively, the following may also be used: an organic material such as benzocyclobutene, parylene, arylene ether fluoride, or light-transmitting polyimide; a compound material made by polymerization of siloxane-based polymer or the like; or a composition material containing water-soluble homopolymer and water-soluble copolymer.

For the first sacrifice layer 206, a commercial resist material containing a photosensitizing agent may also be used. For example, a typical positive resist such as a novolac resin and a photosensitive agent such as a naphthoquinonediazide compound; a negative resist such as a base resin; diphenylsilanediol; an acid generating material; or the like can be used.

Surface tension and viscosity of any material are appropriately adjusted by controlling the concentration of a solvent into which the material is mixed or by adding surfactant or the like. For example, by adding surfactant, surface tension of the solvent can be reduced.

A film is formed using the above-described material and etched into a predetermined shape to form the first sacrifice layer 206. Photolithography can be used for the etching. Alternatively, a mask may be drawn with a droplet ejecting apparatus such as an ink-jet apparatus and the mask may be used for the etching of the first sacrifice layer 206. By drawing a mask with a droplet ejecting apparatus as described above, steps of exposure and development required for photolithography can be omitted, and waste of a mask material can be eliminated.

Thickness of the first sacrifice layer 206 is determined in consideration of a material of the first sacrifice layer 206, a structure and a driving method of a structure body, a method of etching the sacrifice layer, and the like. For example, if the first sacrifice layer 206 is too thin, an etching agent does not diffuse so that such a phenomenon that the first sacrifice layer 206 is not etched or a structure layer buckles after being etched, occurs.

In addition, in the case where the structure body is driven by electrostatic force, it cannot be operated if the first sacrifice layer 206 is too thick. For example, in the case where the structure body is operated by electrostatic force generated between the lower conductive layer and the structure layer, the thickness of the first sacrifice layer 206 may be set in the range of 0.5 μm to 3 μm, and may be preferably set at 1 μm to 2.5 μm.

Subsequently, over the first sacrifice layer 206 and the insulating layer 205, a first conductive layer 207 is formed, and over that, a second conductive layer 208 is formed (see FIGS. 6C-1 and 6C-2). These conductive layers can be formed sequentially by sputtering, CVD, or the like.

Each of the first conductive layer 207 and the second conductive layer 208 is formed using a metal element selected among Ta, W, Ti, Mo, Al, and Cu, or an alloy material or a compound material containing the above-described metal element as a main ingredient, with a thickness of about 50 nm to 2 μm. Alternatively, a semiconductor layer typified by a polycrystalline silicon layer doped with an impurity element such as phosphorus, or an AgPdCu alloy may be used for each conductive layer.

Next, a mask 209 is formed into a predetermined shape (see FIGS. 6C-1 and 6C-2). The mask 209 is formed using the same material as the first sacrifice layer 206 or a material which can be treated by the same step as the first sacrifice layer 206.

The first conductive layer 207 and the second conductive layer 208 are etched using the mask 209. Specifically, a second sacrifice layer 211 and the second conductive layer 208 are formed by ICP (Inductively Coupled Plasma) etching. In this time, such processing that a cross-sectional surface thereof becomes vertical or becomes a taper shape may be performed by anisotropic etching. By determining an etching condition (e.g., the amount of power applied to a coil-shaped electrode, the amount of power applied to an electrode on a substrate side, or the temperature of the electrode on the substrate side), a structure layer 210 and the first conductive layer 207 can be etched into an arbitrary taper shape (see FIGS. 7A-1 and 7A-2). As the etching gas, a chlorine gas typified by $Cl_2$, $BCl_3$, $SiCl_4$, or $CCl_4$ or a fluoride gas typified by $CF_4$, $SF_6$, or $NF_3$ can be used. Alternatively, ashing using $O_2$ may be performed. Further, a rare gas may also be mixed.

Figures 1, 7A:
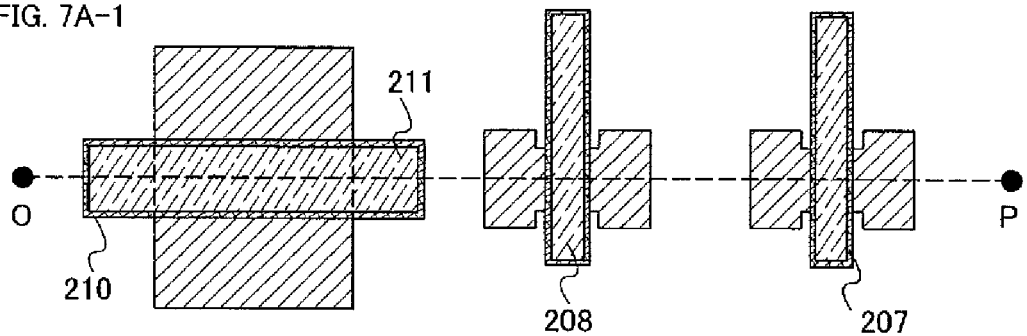
Figures 2, 7A:
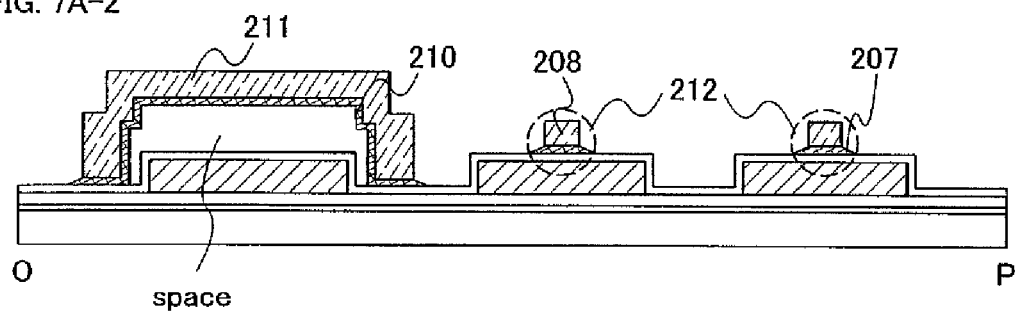

Subsequently, the first sacrifice layer 206 and the mask 209 are peeled off at the same time, so that the structure layer 210, the second sacrifice layer 211, and a gate electrode layer 212 are shaped (see FIGS. 7A-1 and 7A-2). The gate electrode layer 212 is structured by the first conductive layer 207 and the second conductive layer 208.

As described above, the first sacrifice layer 206 is etched at the step of removing the mask 209. Thus the step of etching only a sacrifice layer can be omitted so that the process can be simplified and damage to the structure layer 210 and the semiconductor element can be reduced; which is the same as Embodiment Mode 1.

The multi-layer structure of the conductive layer is not limited to a two-layer structure, and may be a three-layer structure. For example, a three-layer structure using tungsten, tungsten nitride, or the like for a first layer, an alloy of aluminum and silicon (Al—Si), or an alloy of aluminum and titanium (Al—Ti) for a second layer, and a titanium nitride, titanium, or the like for a third layer in order may be employed. In this case, the first layer and the second layer are used as the structure layer of the microstructure body, and the third layer can be used as the second sacrifice layer. Alternatively, the first layer may be used as the structure layer, and the second layer and the third layer may be used as the sacrifice layer. Needless to say, the conductive layer may have a single-layer structure.

Next, similarly to Embodiment Mode 1, impurity elements are added into the active layer 204 for structuring a semiconductor element to form an N-type impurity region and a P-type impurity region. After that, thermal treatment such as activating the impurity regions or dehydrogenating may be performed.

In addition, similarly to Embodiment Mode 1, in the case where the gate electrode layer 212 is formed with a conductive layer having a single-layer structure, or in the case where a conductive layer having a multi-layer structure is not etched into a taper shape, by forming an insulating layer over the gate electrode layer 212 and etching anisotropically the insulating layer, a sidewall can be formed in contact with a side face of the gate electrode layer 212.

Figures 1, 7B:
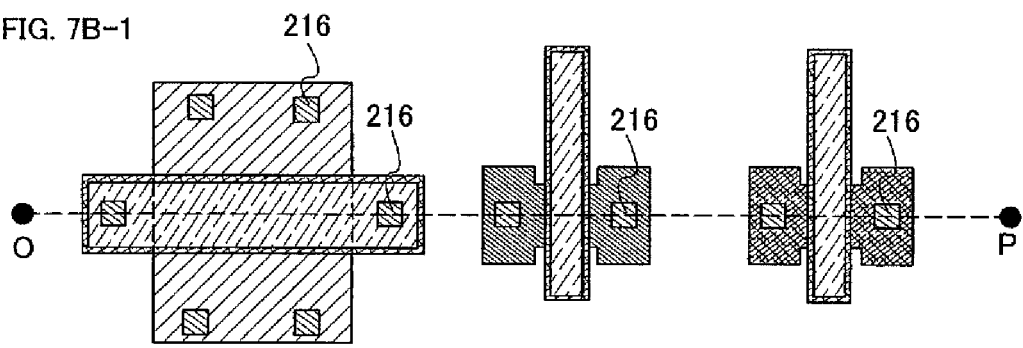
Figures 2, 7B:
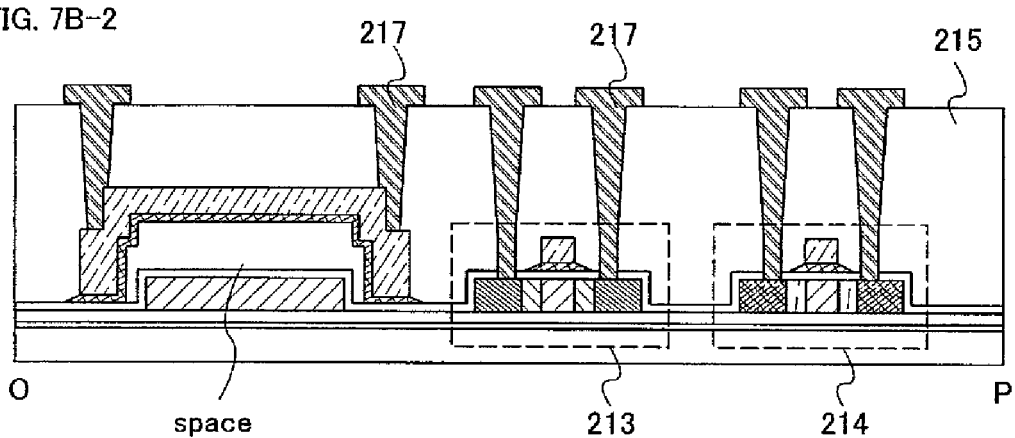

Through the above-described steps, an N-type semiconductor element 213 and a P-type semiconductor element 214 are formed (see FIGS. 7B-1 and 7B-2). In this time, in the semiconductor layer 203 for structuring a microstructure body, an impurity region is formed in a region which is not covered with the structure layer 210 and the second sacrifice layer 211.

Subsequently, an interlayer insulating layer 215 (second insulating layer) is formed to cover the entire surface (see FIGS. 7B-1 and 7B-2). The interlayer insulating layer 215 can be formed of an inorganic material or an organic material having an insulating property. The inorganic material or the organic material is the same as in Embodiment Mode 1.

Next, similarly to Embodiment Mode 1, the interlayer insulating layer 215 and the insulating layer 205 are etched in order, to form a contact hole 216 for connecting wiring to the semiconductor layer 203, the active layer 204, and the structure layer 210. A material for forming a conductive layer is filled in the contact hole 216, a third conductive layer 217 is formed covering the interlayer insulating layer 215 and etched into a predetermined shape, so that wiring or the like for structuring a source electrode, a drain electrode, and an electrical circuit is formed (see FIGS. 7B-1 and 7B-2).

In the case of forming a pattern where the third conductive layer 217 has a corner, the corner portion is preferably etched so as to have roundness.

Figures 1, 8A:
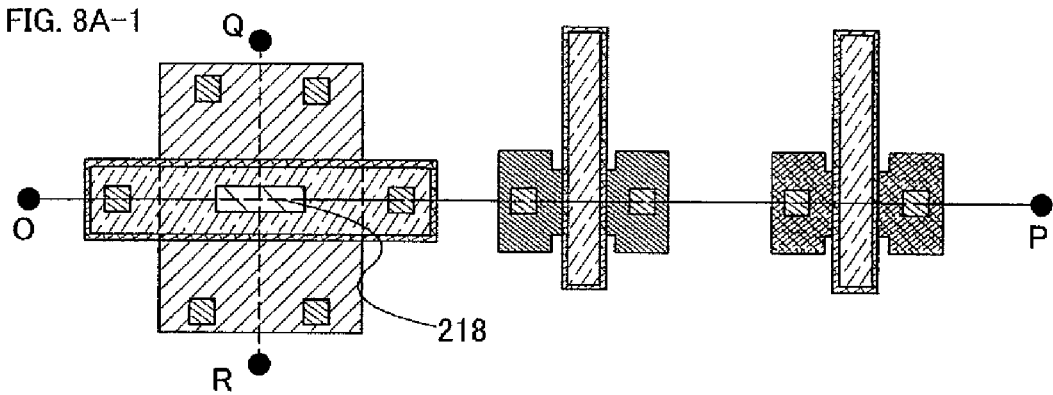
Figures 2, 8A:
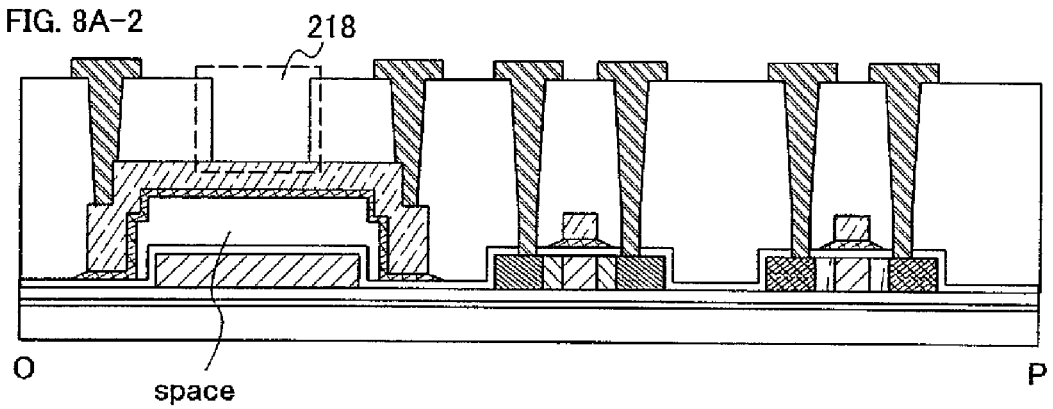

Subsequently, the interlayer insulating layer 215 is etched to form an opening portion 218 for exposing the second sacrifice layer 211 (see FIGS. 8A-1 and 8A-2). Either dry etching or wet etching is used for the etching treatment.

In this embodiment mode, the opening portion 218 is formed by dry etching. The opening portion 218 is formed for etching away the second sacrifice layer 211. Thus the diameter of the opening portion 218 is determined such that an etching agent can flow in and diffuse.

Further, the opening portion 218 may be formed to have a large diameter such that the second sacrifice layer 211 can easily be etched. That is, the contact hole is not necessarily formed as a small hole, unlike that as described above, and the opening portion 218 can be formed so as to expose the sacrifice layer entirely, with the necessary portion of the interlayer insulating layer 215 (e.g., a portion over the semiconductor layer 203 and the active layer 204) left.

Figures 1, 8B:
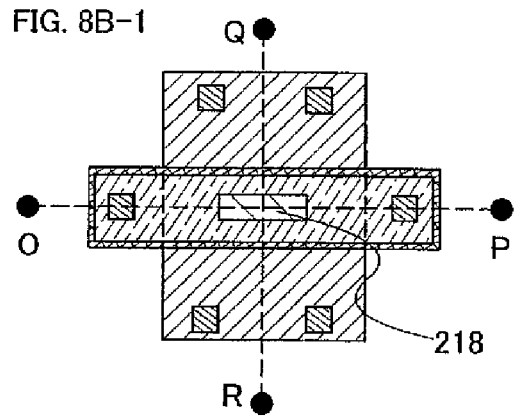
Figures 2, 8B:
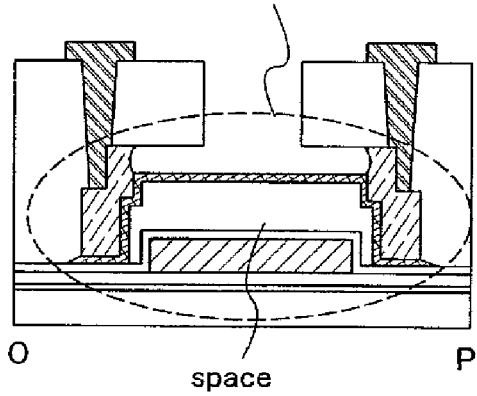

Next, the second sacrifice layer 211 is removed by etching (see FIGS. 8B-1 and 8B-2). Only a microstructure body is shown in FIGS. 8B-1 and 8B-2. Using an etchant or an etching gas suitable for the material of the sacrifice layer, the sacrifice layer is removed by etching through the opening portion 218.

For example, the second sacrifice layer 211 which is formed of tungsten (W) is soaked in a solution in which 28 wt % of ammonia and 31 wt % of oxygenated water are mixed at a ratio of 1:2, for about 20 minutes. In the case where the second sacrifice layer 211 is formed of silicon dioxide, buffered hydrofluoric acid in which a solution of 49 wt % of hydrofluoric acid and ammonium fluoride are mixed at a ratio of 1:7 is used. In the case where the second sacrifice layer 211 is formed of silicon, phosphoric acid; a hydroxide of an alkali metal such as KOH, NaOH, or CsOH NH$_4$OH; hydrazine; EPD (a mixture of ethylenediamine, pyrocatechol, and water), a solution of TMAH, IPA, or NMD3; or the like is used. In drying after wet etching, rinsing is carried out using a low viscosity organic solvent (e.g., cyclohexane); drying is carried out under conditions of low temperature and low pressure; or both of them described above are combined; thus, the microstructure body can be prevented from buckling due to capillary action.

Further, the second sacrifice layer 211 can also be removed by dry etching using F$_2$ or XeF$_2$ under a condition of high pressure such as atmospheric pressure. In addition, in order to prevent the microstructure body from buckling due to capillary action, the surface of the microstructure body may be treated with plasma so as to be water repellent. By removing the second sacrifice layer 211 through such a step, a microstructure body 219 can be formed.

By forming a structure layer of a microstructure body by using a conductive layer for structuring a gate electrode as described in this embodiment mode, the microstructure body which exhibits high mechanical strength, with a flexible movable portion can be formed.

Embodiment Mode 6

According to the invention, microstructure bodies and semiconductor elements having various structures can be formed by changing a part of the above steps, or adding another step to the above steps.

For example, although the second sacrifice layer 211 is etched away and only the conductive layer structuring the first conductive layer 207 is used as the structure layer 210 in Embodiment Mode 5, the microstructure body can also be formed without etching the second sacrifice layer 211 away. In this case, in Embodiment Mode 5 for example, the opening portion 218 for etching the second sacrifice layer 211 away is not required.

As described above, the invention can be applied to various processes. That is, there is no limitation of the structure of the invention as long as a sacrifice layer can be removed by a step of removing a mask.

This embodiment mode can be freely combined with any of Embodiment Modes 1 to 5.

Embodiment Mode 7

Described in this embodiment mode will be a mode in which a counter substrate 221 is attached to a micro-electro-mechanical device which is formed over the insulating substrate 101, in order to protect the microstructure body 219.

Figure 10A:
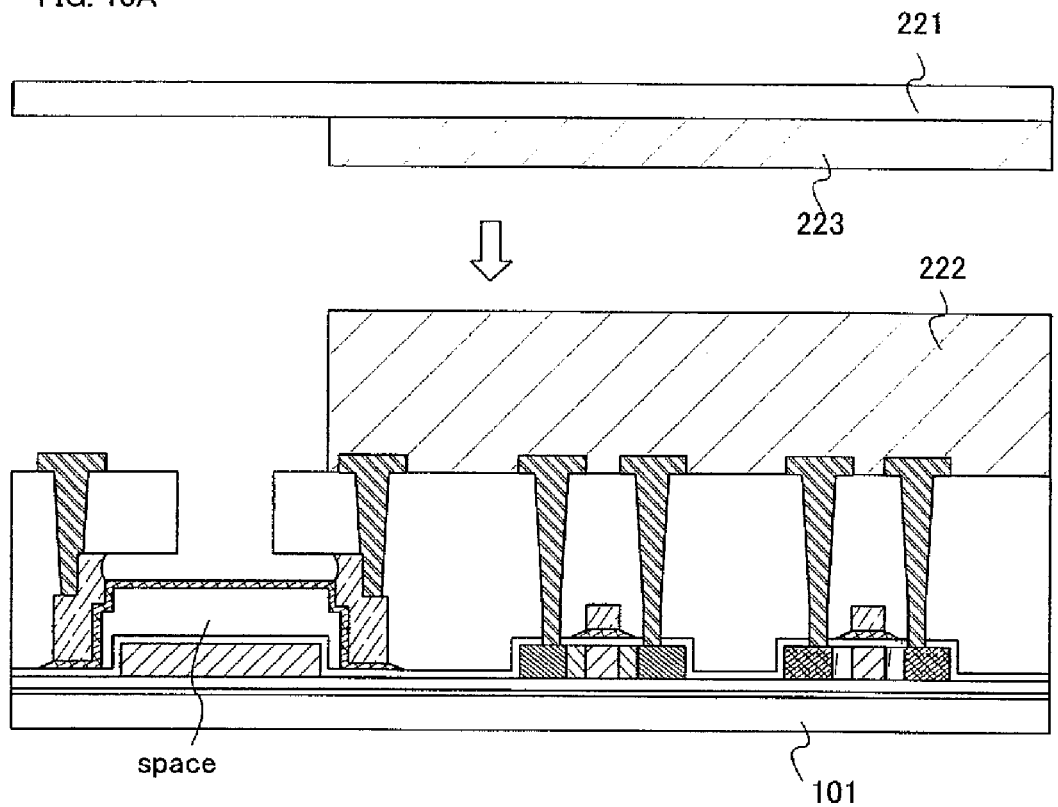
FIGS. 10A and 10B illustrate a manufacturing method of a micro-electro-mechanical device of the invention.
Figure 10B:
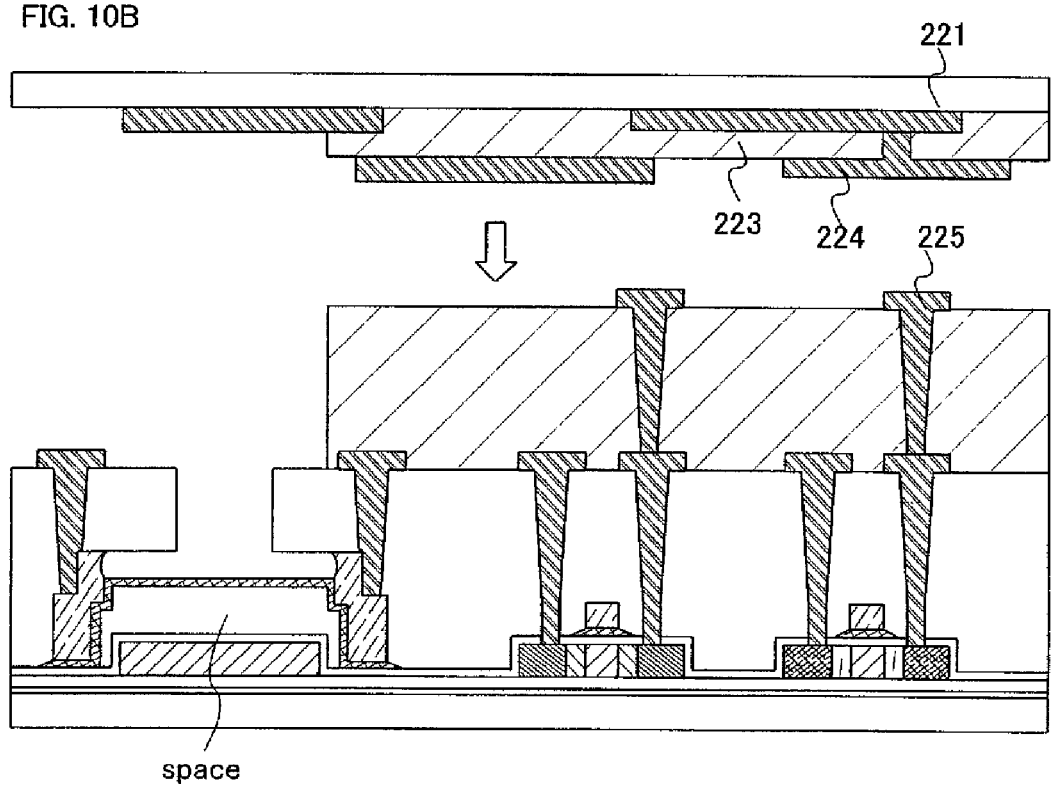

As shown in FIGS. 10A and 10B, in the case of attaching the counter substrate 221, after the third conductive layer 217 is formed, a second insulating layer 222 is formed over the insulating substrate 101 and etched into a predetermined shape (in this embodiment mode, the interlayer insulating layer 215 is a first insulating layer). In this time, the second conductive layer is etched so as to expose the sacrifice layer and the structure layer for structuring a microstructure body. Then, the sacrifice layer is removed to form the microstructure body.

Next, description will be made on the counter substrate 221 to be attached. In a step of attaching the counter substrate 221, a third insulating layer 223 is formed in a portion which is opposite to the second insulating layer 222 formed over the insulating substrate 101, in order to prevent the microstructure body from being broken (see FIG. 10A). Since the third insulating layer 223 is not formed in a portion which is opposite to the microstructure body formed over the insulating substrate 101 so that a space is formed between the substrates, the microstructure body is not broken when the insulating substrate 101 and the counter substrate 221 are attached to each other.

Further, for the counter substrate 221, a fourth conductive layer 224 which is etched into a predetermined shape, an antenna, or the like for structuring a circuit of a micro-electro-mechanical device can be provided (see FIG. 10B). In this case, over the second insulating layer 222 which is formed over the insulating substrate 101, a second wire (a fifth conductive layer 225) for connecting to a first wire (the third conductive layer 217) is formed. Then, the insulating substrate 101 and the counter substrate 221 can be attached to each other such that the fifth conductive layer 225 and the fourth conductive layer 224 are electrically connected to each other.

In this time, as described above, it is preferable that the counter substrate 221 is not in contact with the microstructure body 219 by forming the third insulating layer 223 in a portion which is not opposite to the microstructure body and a portion where the second conductive layer and the third conductive layer are in contact with each other, in order to protect the microstructure body 219 formed over the insulating substrate 101. In addition, the fourth conductive layer 224 may be formed only above the third insulating layer 223, or the fourth conductive layers 224 formed above and below the third insulating layer 223 may be electrically connected (see FIG. 10B).

This embodiment mode can be freely combined with any of Embodiment Modes 1 to 6.

Embodiment Mode 8

Described in this embodiment mode will be a method of peeling the insulating substrate 101 off and attaching to another substrate or object.

Figure 11A:
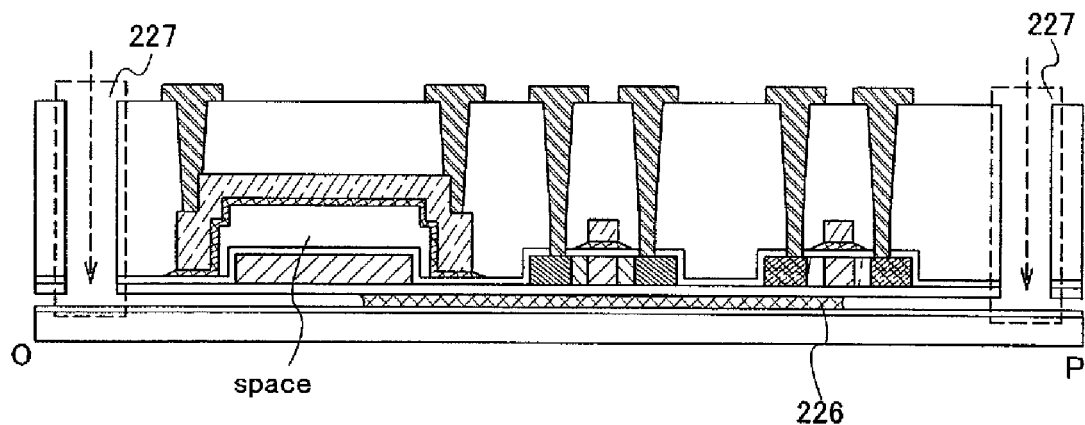
FIGS. 11A to 11C illustrate a manufacturing method of a micro-electro-mechanical device of the invention.

In the case of separating the micro-electro-mechanical device from the insulating substrate 101, a peeling layer 226 is formed when the base layer 102 is formed (see FIG. 11A). The peeling layer 226 can be formed under the base layer which has a multi-layer structure, or between the stacked layers of the base layer. Then, after forming the third conductive layer 217 as described above, the micro-electro-mechanical device is separated from the substrate before the opening portion 218 for etching the sacrifice layer is formed.

Figure 11B:
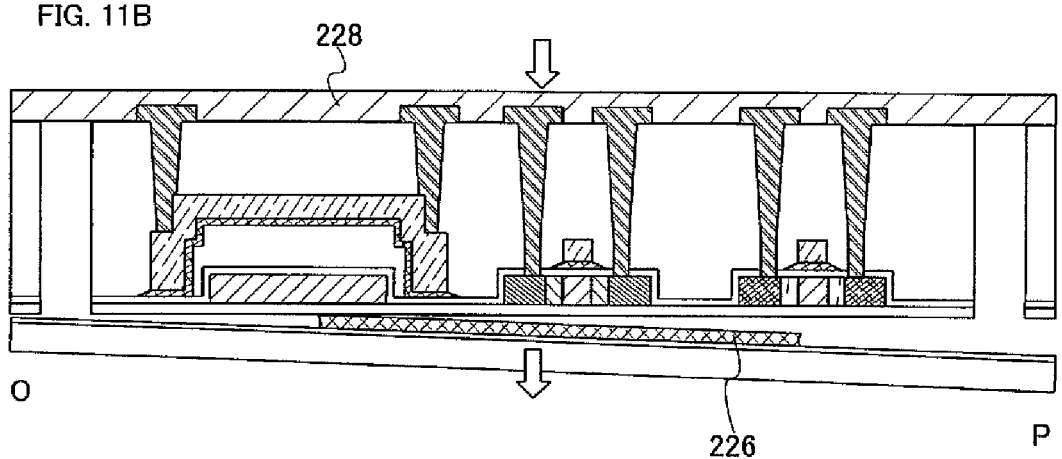
Figure 11C:
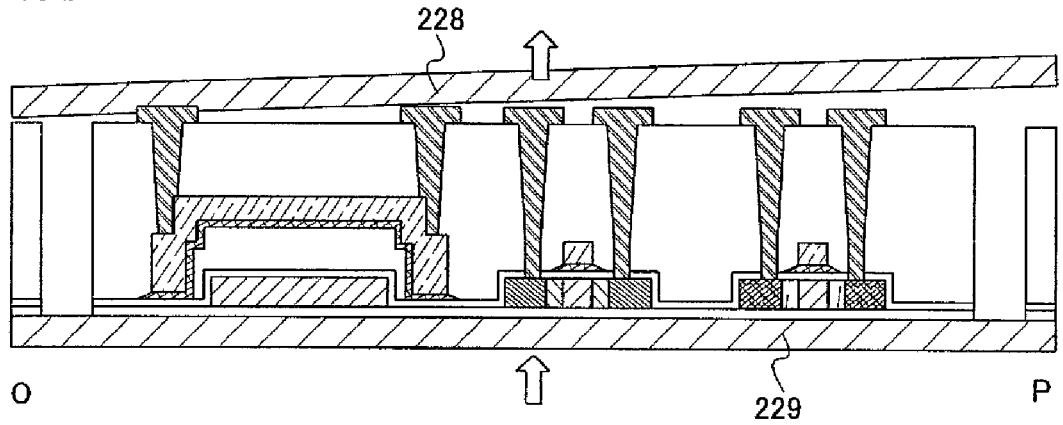

There are various methods of the separation; one example thereof will be described here. First, an opening portion 227 is formed to expose the peeling layer 226 and an etching agent is injected into the opening portion 227, thereby partially removing the peeling layer 226 (see FIG. 11A). Next, a substrate 228 for separation is attached onto a top surface side of the insulating substrate 101, and the semiconductor element and the microstructure body are separated from the insulating substrate 101 at a boundary of the peeling layer 226, and then are transferred to the substrate for separation (see FIG. 11B). Then, a flexible substrate 229 is attached to a side of the semiconductor element and the microstructure body, which had been in contact with the insulating substrate 101. Then the substrate 228 for separation attached above the top surface side is peeled off, thereby transferring the substrate (see FIG. 11C). In this manner, after the micro-electro-mechanical device is manufactured over a glass substrate, it can be attached to a flexible substrate such as plastic that is thinner and softer than glass.

Then, an opening portion is formed to expose the sacrifice layer, and the sacrifice layer is etched away, thereby a microstructure body is formed. Further, a protective film may be formed over a wiring in order to protect the third conductive layer 217 or the like at the time of peel-off.

In addition, in the case where the microstructure body is required to be protected, the counter substrate 221 described in Embodiment Mode 7 can be used as the substrate for separation.

Although this embodiment mode describes a method in which the peeling layer 226 is etched through the opening portion 227 and the semiconductor element and the microstructure body are then transferred to the flexible substrate 229, the invention is not limited to this. For example, there are a method in which the peeling layer 226 is removed only by an etching step, then the semiconductor element and the microstructure body are transferred to the flexible substrate 229, and a method in which the opening portion 227 is not provided, the substrate 228 for separation is attached onto the top surface side of the insulating substrate 101 and the semiconductor element and the microstructure body are separated from the insulating substrate 101. In addition, there are also a method in which the back surface of the insulating substrate 101 is polished to obtain the semiconductor element, the microstructure body, and the like. Such methods may also be arbitrarily combined. By adopting a step of transferring the semiconductor element and the microstructure body to the flexible substrate 229, the insulating substrate 101 can be reused, except for the case where the back surface of the insulating substrate 101 is polished.

As described above, by peeling the semiconductor element and the microstructure body formed over the insulating substrate 101 off and attaching to the flexible substrate 229, a thin, soft, and compact micro-electro-mechanical device can be manufactured.

This embodiment mode can be freely combined with any of the above-described other Embodiment Modes.

Embodiment Mode 9

In this embodiment mode, a constitution example of the micro-electro-mechanical device of the invention will be described with reference to the drawings.

Figure 12:
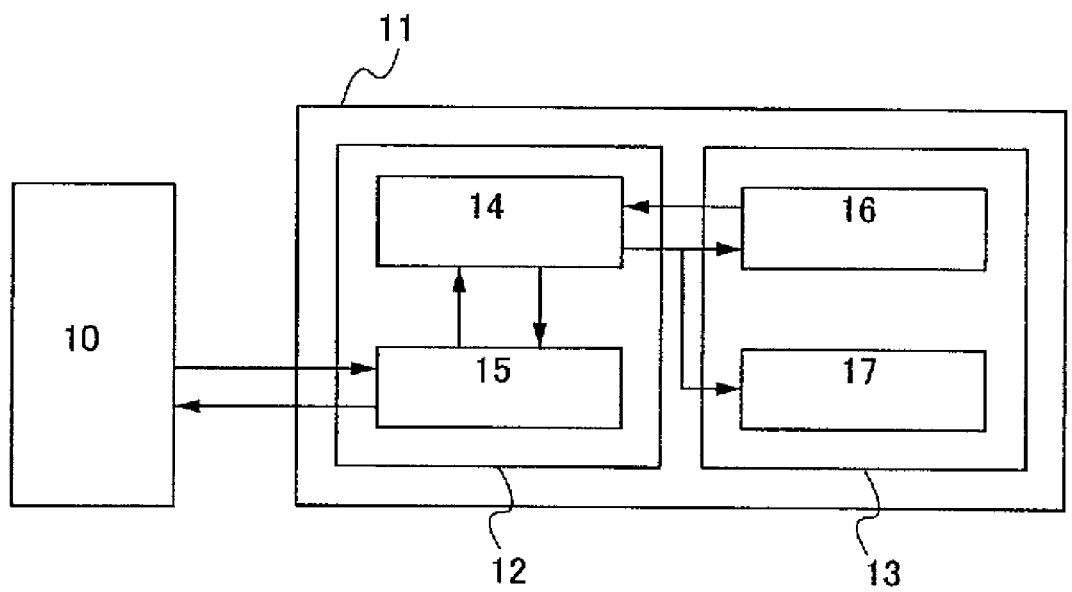
FIG. 12 illustrates a micro-electro-mechanical device of the invention.

A schematic diagram of the micro-electro-mechanical device of the invention is shown in FIG. 12. A micro-electro-mechanical device 11 of the invention includes an electric circuit portion 12 including a semiconductor element and a structure body portion 13 constituted from a microstructure body. The electric circuit portion 12 includes a control circuit 14 for controlling the microstructure body, an interface 15 for communicating with an external control device 10, and the like. The structure body portion 13 includes a sensor 16, an actuator 17, a switch, and the like by using the microstructure body.

An actuator is a component element for converting a signal (mainly an electrical signal) into a physical quantity.

Further, the electric circuit portion 12 can also include a central processing unit for processing information obtained by the structure body portion 13, or the like.

The external control device 10 performs operation such as transmitting a signal for controlling the micro-electro-mechanical device 11, receiving information obtained by the micro-electro-mechanical device 11, and supplying driving power to the micro-electro-mechanical device 11.

The invention is not limited to the above constitution. That is, according to the invention, a micro-electro-mechanical device includes an electric circuit which includes a semiconductor element and controls a microstructure body, and the microstructure body which is controlled by the electric circuit.

Conventionally, in the case of handling a minute object with a unit of millimeter or smaller, a process has been required in which the structure of the minute object is enlarged, humans or a computer obtain its information to determine the data processing and operation, and the operation is reduced and transmitted to the minute object.

However, the micro-electro-mechanical device of the invention which is described above allows operation just by humans or a computer supplying a broader instruction. That is, by humans or a computer determining an objective and transmitting an instruction, the micro-electro-mechanical device can obtain information on an object by using a sensor or the like and process the information, thereby operating.

In the above example, the object is assumed to be minute. This includes, for example, a case where an object which itself has a size with a unit of meter sends a small signal (e.g., a small change in light or pressure).

The micro-electro-mechanical device of the invention is in the field of micromachines, and the unit of the size is in the range of micrometer to millimeter. Further, in the case of manufacturing as a component incorporated in a mechanical apparatus, the micro-electro-mechanical device may have the size with a unit of meter so as to be able to handle easily in assembling.

Embodiment Mode 10

In this embodiment mode, an example of the micro-electro-mechanical device described in the above embodiment modes will be described. The micro-electro-mechanical device of the invention can include a sensor device in which a detector element is constituted from a microstructure body.

Figure 13A:
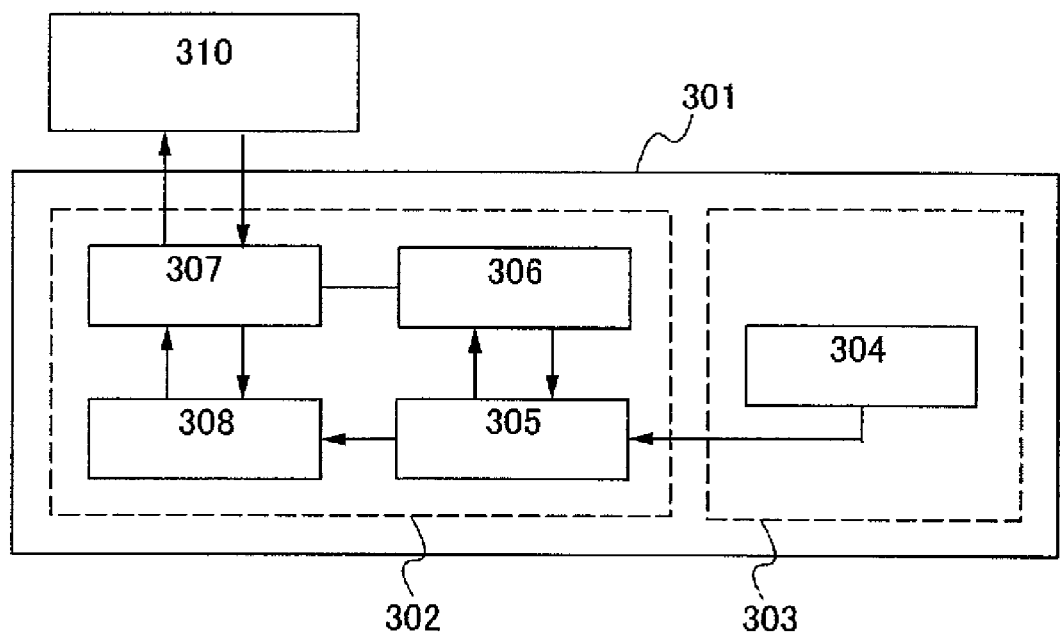
FIGS. 13A and 13B illustrate one mode of a micro-electro-mechanical device of the invention.

FIG. 13A shows a constitution of a sensor device 301 which is one mode of the micro-electro-mechanical device of the invention. The sensor device 301 of this embodiment mode includes an electric circuit portion 302 including a semiconductor element and a structure body portion 303 constituted from a microstructure body.

The structure body portion 303 includes a detector element 304 constituted from a microstructure body, which detects external pressure, concentration of a substance, a flow rate of gas or fluid, or the like.

The electric circuit portion 302 includes an AD converter circuit 305, a control circuit 306, an interface 307, a memory 308, and the like.

The AD converter circuit 305 converts information transmitted from the detector element 304 into a digital signal. The control circuit controls the AD converter circuit, e.g., so that the digital signal is stored in the memory. The interface 307 receives driving power or a control signal from an external control device 310, or transmits sensing information to the external control device 310, or the like. The memory 308 stores sensing information, information specific to the sensor device, or the like.

Further, the electric circuit portion 302 may also include an amplifier circuit for amplifying a signal received from the structure body portion 303, a central processing circuit for processing information obtained by the structure body portion 303, or the like.

The external control device 310 performs operation such as transmitting a control signal of the sensor device 301 and receiving information obtained by the sensor device 301, or supplying driving power to the sensor device 301.

With the sensor device 301 having the above constitution, external pressure, concentration of a substance, a flow rate of gas or fluid, temperature, or the like can be detected. Further, in the case where the sensor device includes a central processing circuit, a sensor device in which detected information is processed in the sensor device and a control signal for controlling another device is generated and output, can also be realized.

Figure 13B:
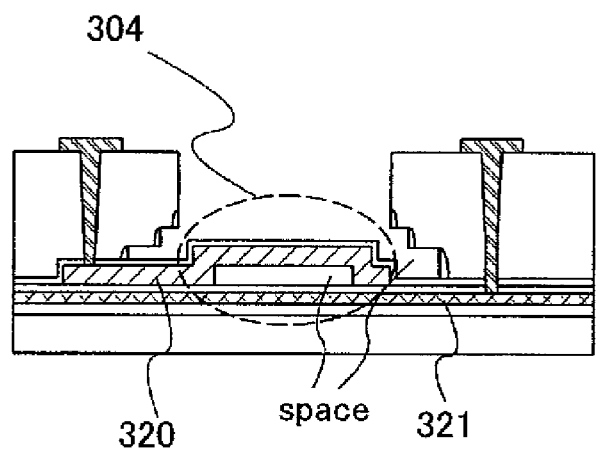

FIG. 13B is a cross-sectional view showing a structural example of the detector element 304. The detector element 304 shown in FIG. 13B is a capacitor including a first conductive layer 320 as a structure layer and a second conductive layer 321 which is provided under a base layer. Further, since the first conductive layer 320 is moved by electrostatic force, pressure, or the like, the detector element 304 is a variable capacitor in which distance between the first conductive layer and the second conductive layer changes.

Utilizing this structure, the detector element 304 can be used as a pressure detector element in which the first conductive layer 320 is moved by pressure.

In addition, in the detector element 304 shown in FIG. 13B, the first conductive layer 320 can be formed by stacking two kinds of materials having different coefficients of thermal expansion. In this case, since the first conductive layer 320 is moved by temperature change, the detector element 304 can be used as a temperature detector element.

The invention is not limited to the above constitution. That is, according to this embodiment mode, a sensor device includes an electric circuit which includes a semiconductor element and controls a microstructure body, and a detector element which is constituted from the microstructure body controlled by the electric circuit and detects some physical quantity. Further, the sensor device is manufactured by the manufacturing method described in any one of the above embodiment modes.

This embodiment mode can be freely combined with any of the above embodiment modes.

Embodiment Mode 11

In this embodiment mode, a specific example of the micro-electro-mechanical device described in the above embodiment modes will be described. The micro-electro-mechanical device of the invention can constitute a memory device in which a memory element includes a microstructure body. Described in this embodiment mode will be an example of a memory device in which a peripheral circuit such as a decoder is constituted using a semiconductor element or the like, and the inside of a memory cell is constituted using a microstructure body.

Figure 14:
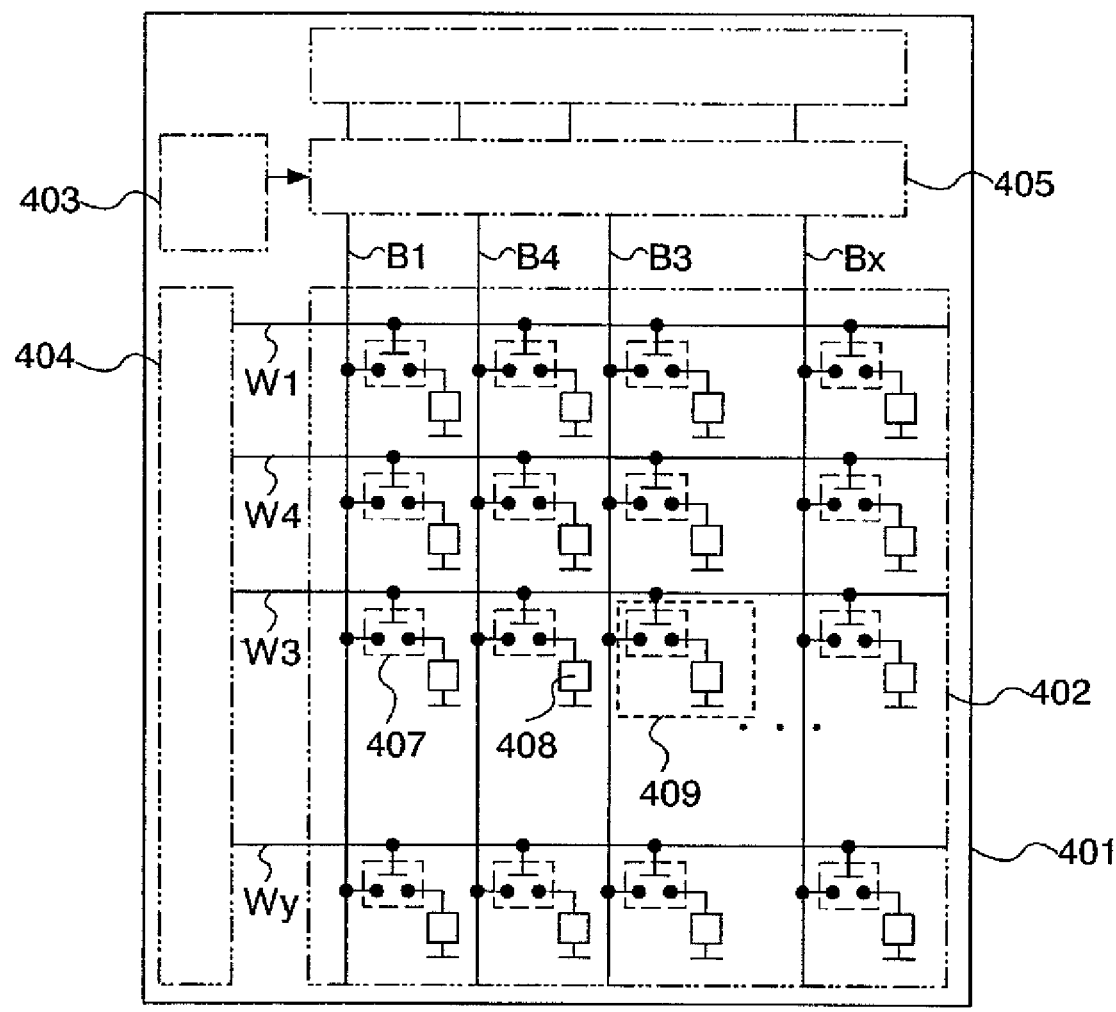
FIG. 14 illustrates one mode of a micro-electro-mechanical device of the invention.

FIG. 14 shows a constitution of a memory device 401 which is one mode of the micro-electro-mechanical device of the invention.

The memory device 401 includes a memory cell array 402, a decoder 403, a selector 404, and a reading/writing circuit 405. A known technology can be used to constitute the decoder 403 and the selector 404.

A memory cell 409 includes, for example, a memory element 408 and a switching element 407 for controlling the memory element 408. According to the memory device 401 described in this embodiment mode, each of the switching element 407 and the memory element 408 is constituted from a microstructure body.

Figure 15A:
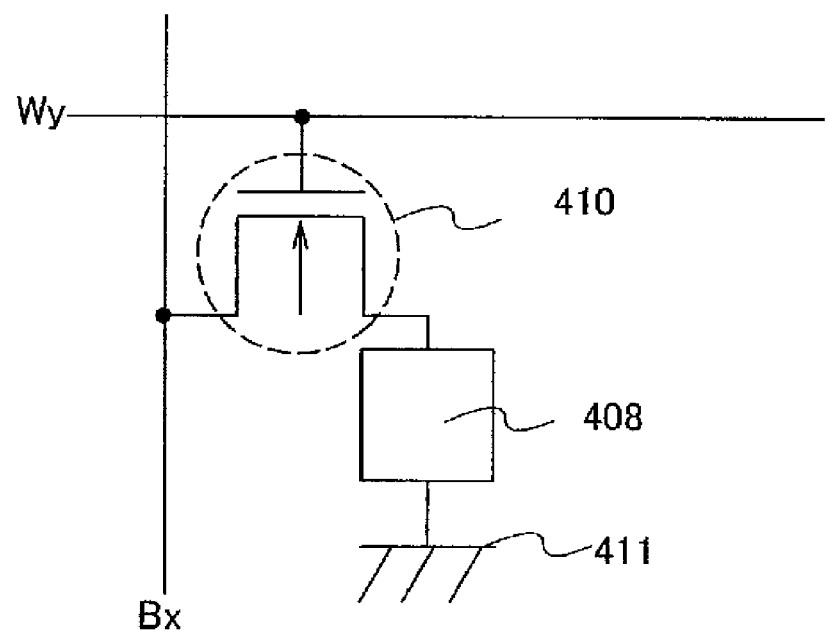
FIGS. 15A and 15B illustrate a structure of a memory cell.
Figure 15B:
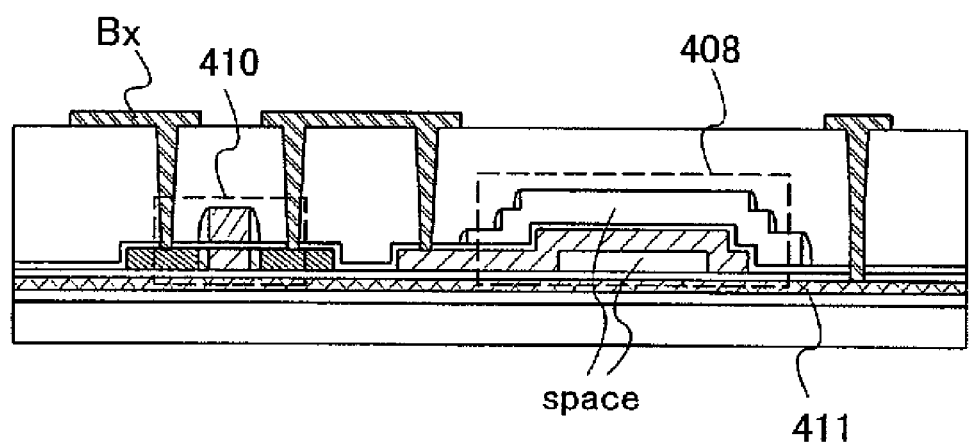

FIGS. 15A and 15B show a configuration example of the memory cell 409. FIG. 15A is a circuit diagram of the memory cell 409 and FIG. 15B is a cross-sectional view of the structure.

As shown in FIG. 15A, the memory cell 409 includes the switching element 407 constituted from a transistor 410 and the memory element 408 constituted from a microstructure body.

As shown in FIG. 15B, the memory element 408 is a microstructure body formed using the manufacturing method described in Embodiment Mode 1 or 2. The memory element 408 is a capacitor including a first conductive layer under a base layer and a second conductive layer as a structure layer. Further, the second conductive layer is connected to one of two high-concentration impurity regions of the transistor 410.

The first conductive layer is commonly connected to the memory elements 408 of all the memory cells 409 in the memory device 401. The first conductive layer applies a same potential to all the memory elements at the time of reading and writing of the memory device, which may be referred to as a common electrode 411 in this specification.

Figure 16:
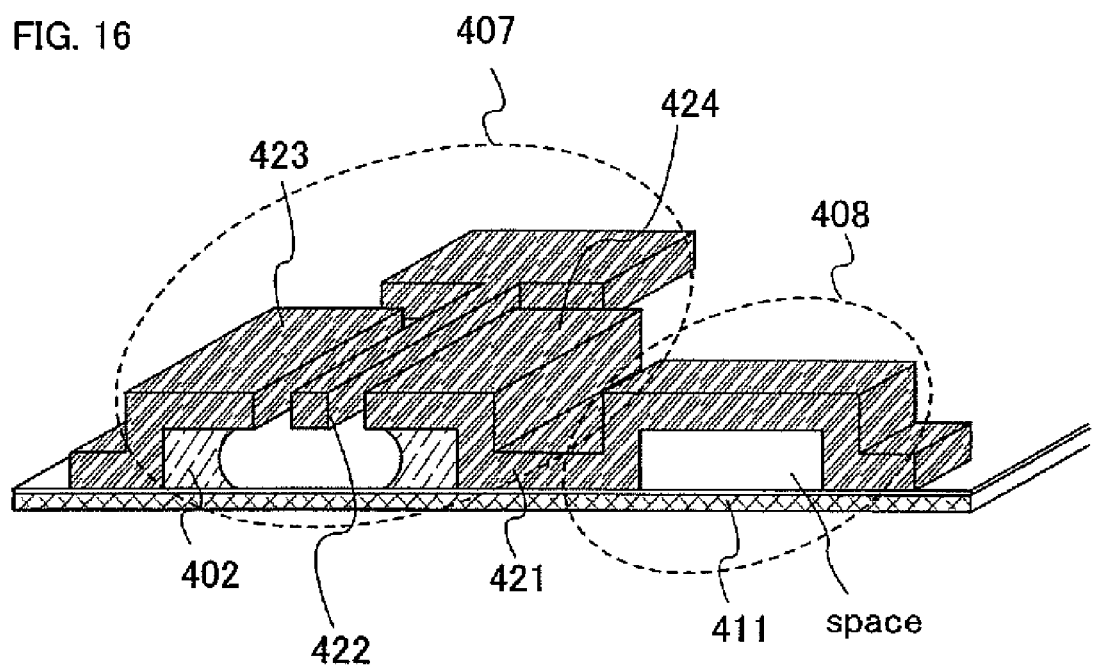
FIG. 16 illustrates a structure of a memory cell.

FIG. 16 shows an example of the memory cell 409 including the switching element 407 and the memory element 408 each of which is constituted from a microstructure body. FIG. 16 is a perspective view of the structure of the memory cell 409.

The switching element 407 and the memory element 408 are formed using the manufacturing method described in Embodiment Mode 1 or 2. The switching element 407 is a microstructure body which serves as a switch with a structure of combining cantilevers, and the memory element 408 is a microstructure body which serves as a capacitor with a beam structure.

Here, the structure of the switching element 407 will be described. In the switching element 407, a sacrifice layer 420 and a structure layer 421 are stacked over a substrate, and a portion under a movable cantilever 422 is etched.

The switching element 407 controls whether the cantilever 422 and a conductive layer 424 are electrically connected or not by a control electrode 423. Specific operation thereof will be described below. The control electrode 423 is always in the state being charged by positive voltage. When positive voltage is input to the cantilever 422, the control electrode 423 and the cantilever 422 act repulsively to each other, so that the cantilever 422 contacts the conductive layer 424, thereby switching can be performed.

Such a switch formed using a microstructure body has an advantage in that a signal transmitting pathway (here, the cantilever 422 and the conductive layer 424) through the switch is completely insulated at the time of OFF. Furthermore, there is another advantage in that a control system for controlling ON/OFF of the switch (here the control electrode 423) and the signal transmitting pathway (here, the cantilever 422 and the conductive layer 424) can be electrically disconnected.

A memory device having the above structure can be used as a volatile memory, typically as a DRAM (Dynamic Random Access Memory). A known technology can be used for the constitution of the peripheral circuit and the driving method or the like.

As to a microstructure body for constituting a memory cell, a scaling law is applied by forming with a minute size (e.g., with a unit of μm), so that response speed of the switch is fast, and high driving power is not required, which is an advantage. Further, by constituting the switching element 407 from a microstructure body, a non-selected memory element 408 can be electrically disconnected completely, thereby the low-power consumption memory device 401 can be realized.

This embodiment mode can be freely combined with any of the above embodiment modes.

Embodiment Mode 12

In this embodiment mode, an example of the micro-electro-mechanical device described in the above embodiment modes will be described.

The micro-electro-mechanical device of the invention can be constituted as, for example, a separation device for separating a particular material from a mixed material. Description thereon will be made below.

Figure 17A:
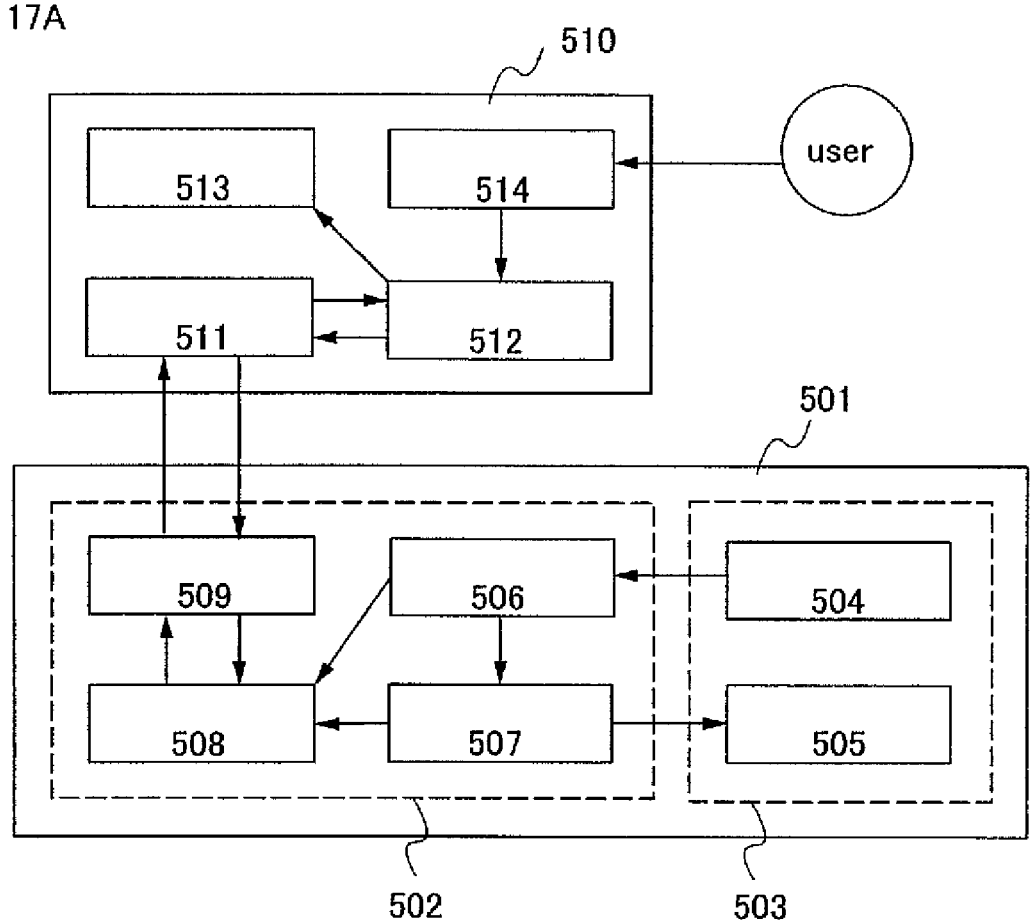
FIGS. 17A and 17B illustrate one mode of a micro-electro-mechanical device of the invention.
Figure 17B:
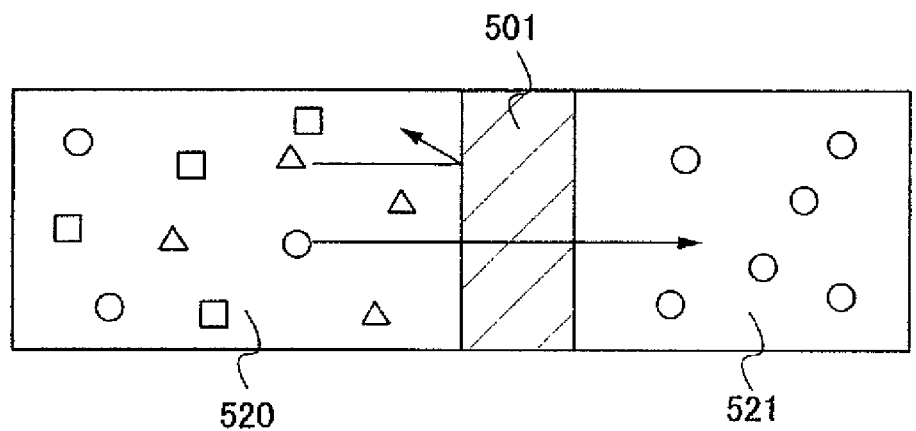

FIGS. 17A and 17B show a basic constitution example of the separation device of this embodiment mode. Here, a separation device which separates a gas of a particular material from a mixed gas of two or more materials will be described as an example of the separation device.

A separation device 501 is broadly divided into two parts of an electric circuit portion 502 and a structure body portion 503. The structure body portion 503 includes a detector element 504 and a plurality of gating means 505. The electric circuit portion 502 includes a signal processing means 506, a gating control means 507, an information storing means 508, and a communication means 509.

Here, each of the detector element 504 and the gating means 505 is constituted from a microstructure body with a size corresponding to a gas molecule to be separated. One detector element 504 is provided adjacent to one gating means 505, and detects what kind of material exists near the gating means 505. The gating means 505 has a passage which is opened only when a control signal is received from the gating control means 507 and a particular material exists near the gating means 505, so that the particular material passes therethrough.

The signal processing means 506 processes a signal transmitted from the detector element 504 by amplification, AD conversion, or the like, to transmit to the gating control means 507. The gating control means 507 controls the gating means 505 based on a signal transmitted from the detector element 504. The information storing device 508 stores a program file for operating the separation device 501, information specific to the separation device 501, or the like. The communication means 509 communicates with an external control device 510.

The external control device 510 includes a communication means 511, an information processing means 512, a display means 513, an input means 514, or the like.

The communication means 511 transmits a signal for controlling the separation device 501 and receives information obtained by the separation device 501, or supplies driving power to the separation device 501, or the like. The information processing means 512 performs operation such as processing information received from the separation device 501, and processing to transmit information input by the input means to the separation device 501. The display means 513 displays information obtained by the separation device 501, the operation status of the separation device 501, or the like. The input means 514 provides a means of inputting information.

FIG. 17B shows one mode example of using the separation device 501. The separation device 501 having the above configuration is disposed between a mixed material system 520 and a particular material system 521. The separation device 501, after receiving information on what material to be separated or the like by the external control device 510, detects what kind of material exists adjacently to the gating means 505 by the detector element 504. Next, a detection signal is processed by the signal processing means 506 and transmitted to the gating control means 507. The gating control means 507 controls the gating means 505 to open the passage only when a material to be separated exists closely to the gating means 505. Further, the gating means 505 passes only the material to be separated through the passage in accordance with control by the gating control means 507.

Through the above operation, the separation device 501 can separate a gas of a particular material from a mixed gas of two or more kinds. In addition, the separation device 501 is not limited to gas separation. For example, using the above configuration, the separation device can also be constituted as a device for separating a particular cell. As an example thereof, the separation device 501 can be controlled to separate only a cell which fluoresces when irradiated with UV light. Further, a device having such a function as separation only of particles having a minute grain boundary, for example, only of particles containing a radioactive substance, or separation only of magnetic ore particles can be realized.

The invention can provide a separation system including the separation device 501, the mixed material system 520, the particular material system 521, and the external control device 510, for separating a particular material from a mixed material.

This embodiment mode can be freely combined with any of the above embodiment modes.

This application is based on Japanese Patent Application serial no. 2005207894 filed in Japan Patent Office on 15, Jul., 2005, the entire contents of which are hereby incorporated by reference.

What is claimed is:

1. A manufacturing method of a micro-electro-mechanical device, comprising:
    forming a semiconductor layer over an insulating substrate;
    forming a first insulating layer over the semiconductor layer;
    selectively forming a first sacrifice layer over the first insulating layer;
    forming a conductive layer over the first sacrifice layer;
    forming a mask over the conductive layer;
    etching the conductive layer by using the mask to expose a part of the first sacrifice layer; and
    removing the mask and the first sacrifice layer by a same step.

2. The manufacturing method of a micro-electro-mechanical device, according to claim 1, further comprising:
    forming a second sacrifice layer over the conductive layer;
    forming a second insulating layer over the second sacrifice layer;
    forming an opening portion in the second insulating layer, whereby exposing a portion of the second sacrifice layer; and
    removing the second sacrifice layer.

3. The manufacturing method of a micro-electro-mechanical device, according to claim 2, wherein a plurality of opening portions are formed in the second insulating layer.

4. The manufacturing method of a micro-electro-mechanical device, according to claim 1, wherein the semiconductor layer includes a silicon layer crystallized using a metal.

5. The manufacturing method of a micro-electro-mechanical device, according to claim 1, wherein the semiconductor layer includes a silicon layer crystallized using a metal, and a silicide containing a metal is formed in the silicon layer.

6. The manufacturing method of a micro-electro-mechanical device, according to claim 1, wherein the semiconductor layer has a multi-layer structure of a silicon layer crystallized using a metal and an amorphous silicon layer.

7. The manufacturing method of a micro-electro-mechanical device, according to claim 1, wherein the mask and the first sacrifice layer are a same material.

8. A manufacturing method of a micro-electro-mechanical device, comprising:
- forming a semiconductor layer in a first region and a second region over an insulating substrate;
- forming a first insulating layer over the semiconductor layer;
- forming a first sacrifice layer over the first insulating layer in the first region only amongst the first region and the second region;
- forming a conductive layer over the first sacrifice layer in the first region and in the second region;
- forming a mask over the conductive layer;
- etching the conductive layer by using the mask to expose a part of the first sacrifice layer; and
- removing the mask and the first sacrifice layer by a same step.

9. The manufacturing method of a micro-electro-mechanical device, according to claim 8, further comprising:
- forming a second sacrifice layer over the conductive layer in the first region and the second region;
- forming a second insulating layer over the second sacrifice layer in the first region and the second region;
- forming an opening portion in the second insulating layer in the first region, whereby exposing a portion of the second sacrifice layer in the first region; and
- removing the second sacrifice layer in the first region.

10. The manufacturing method of a micro-electro-mechanical device, according to claim 9, wherein a plurality of opening portions are formed in the second insulating layer in the first region.

11. The manufacturing method of a micro-electro-mechanical device, according to claim 8, wherein the semiconductor layer includes a silicon layer crystallized using a metal.

12. The manufacturing method of a micro-electro-mechanical device, according to claim 8, wherein the semiconductor layer includes a silicon layer crystallized using a metal, and a silicide containing a metal is formed in the silicon layer.

13. The manufacturing method of a micro-electro-mechanical device, according to claim 8, wherein the semiconductor layer has a multi-layer structure of a silicon layer crystallized using a metal and an amorphous silicon layer.

14. The manufacturing method of a micro-electro-mechanical device, according to claim 8, wherein the mask and the first sacrifice layer are a same material.

* * * * *